(12) United States Patent
Kano

(10) Patent No.: US 10,623,003 B2
(45) Date of Patent: Apr. 14, 2020

(54) CIRCUIT DEVICE, OSCILLATOR, ELECTRONIC APPARATUS, AND VEHICLE

(71) Applicant: Seiko Epson Corporation, Tokyo (JP)

(72) Inventor: Shinnosuke Kano, Minowa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/193,172

(22) Filed: Nov. 16, 2018

(65) Prior Publication Data
US 2019/0158099 A1 May 23, 2019

(30) Foreign Application Priority Data

Nov. 17, 2017 (JP) ................... 2017-221537

(51) Int. Cl.
| | | |
|---|---|---|
| *H03L 1/02* | (2006.01) | |
| *H03B 5/04* | (2006.01) | |
| *H03M 1/46* | (2006.01) | |
| *H03M 1/48* | (2006.01) | |
| *H03M 1/66* | (2006.01) | |

(52) U.S. Cl.
CPC ............ *H03L 1/026* (2013.01); *H03B 5/04* (2013.01); *H03L 1/028* (2013.01); *H03M 1/462* (2013.01); *H03M 1/48* (2013.01); *H03M 1/66* (2013.01)

(58) Field of Classification Search
CPC ..................................... H03L 1/026
USPC ............................................ 331/176
See application file for complete search history.

(56) References Cited

U.S. PATENT DOCUMENTS

| | | | | |
|---|---|---|---|---|
| 2004/0222856 | A1* | 11/2004 | Hein | ............ H03L 1/022 331/16 |
| 2017/0155393 | A1* | 6/2017 | Hattori | ............ H03B 5/32 |
| 2017/0163264 | A1 | 6/2017 | Kano | |
| 2017/0194965 | A1* | 7/2017 | Yonezawa | ........... H03L 1/00 |

FOREIGN PATENT DOCUMENTS

| | | |
|---|---|---|
| JP | H11-317623 A | 11/1999 |
| JP | 2000-349553 A | 12/2000 |
| JP | 2001-136029 A | 5/2001 |
| JP | 2013-150033 A | 8/2013 |
| JP | 2017-103661 A | 6/2017 |

* cited by examiner

*Primary Examiner* — Joseph Chang
(74) *Attorney, Agent, or Firm* — Harness, Dickey & Pierce, P.L.C.

(57) ABSTRACT

A circuit device includes an A/D conversion circuit that performs an A/D conversion of a temperature detection voltage, a digital filter that performs digital filter processing of A/D output temperature detection data, a selector that selects A/D output temperature detection data during an activation period and selects filter output temperature detection data during a normal operation period after the activation period, a digital signal processing circuit that outputs frequency control data of an oscillation frequency based on selector output temperature detection data, and an oscillation signal generation circuit that generates an oscillation signal of an oscillation frequency set by frequency control data.

11 Claims, 13 Drawing Sheets

CIRCUIT DEVICE, OSCILLATOR, ELECTRONIC APPARATUS, AND VEHICLE

BACKGROUND

1. Technical Field

The present invention relates to a circuit device, an oscillator, electronic apparatus, and vehicle.

2. Related Art

An oscillator that performs temperature compensation processing of an oscillation frequency by using temperature detection data that is a result of an A/D conversion of a temperature detection voltage (analog signal) from a temperature sensor is known. For example, a temperature compensation type oscillator called a temperature compensated crystal oscillator (TCXO) is known. The TCXO is used as a reference signal source or the like in, for example, a mobile communication terminal, a GPS related apparatus, a wearable apparatus, or an in-vehicle apparatus or the like.

The oscillator has a demand for outputting A/D conversion result data resulting from an A/D conversion at a high speed (during a short A/D conversion period). For example, there is a case where there is a demand for stabilizing an oscillation frequency in a short time when the oscillator is activated, and in that case, temperature detection data used for temperature compensation processing has to be able to be output at a high speed. For example, an activation time until the oscillation frequency is stabilized is defined in the specifications, and it is necessary to output the temperature detection data at a high speed so as to satisfy the specifications.

For example, JP-A-2017-103661 discloses an A/D conversion unit having a configuration conforming to a successive approximation type, the A/D conversion unit performs an A/D conversion in a high speed mode after the A/D conversion unit is activated, and thereafter, performs the A/D conversion in a normal operation mode. As the A/D conversion unit performs the A/D conversion of a temperature detection voltage, the A/D conversion of the temperature detection voltage is performed at a high speed when an oscillator is activated.

It is necessary for an oscillator that performs temperature compensation processing to process temperature detection data used for the temperature compensation processing at a high accuracy so as to improve an accuracy of an oscillation frequency. In addition, as described above, since there is a demand for stabilizing the oscillation frequency in a short time when being activated, it is necessary to improve the accuracy of the temperature detection data and to prevent time until the oscillation frequency is stabilized from increasing.

SUMMARY

An advantage of some aspects of the invention is to solve at least a part of the problems described above, and the invention can be implemented as the following forms or embodiments.

An aspect of the invention relates to a circuit device including an A/D conversion circuit that performs an A/D conversion of a temperature detection voltage from a temperature sensor and outputs data for which the A/D conversion is completed as A/D output temperature detection data; a digital filter that performs digital filter processing of the A/D output temperature detection data and outputs data for which the digital filter processing is completed as filter output temperature detection data; a selector that selects the A/D output temperature detection data during an activation period to output as selector output temperature detection data and selects the filter output temperature detection data during a normal operation period after the activation period to output as the selector output temperature detection data; a digital signal processing circuit that outputs frequency control data of an oscillation frequency based on the selector output temperature detection data; and an oscillation signal generation circuit that generates an oscillation signal of the oscillation frequency which is set by the frequency control data from the digital signal processing circuit.

According to the aspect of the invention, by performing digital filter processing of A/D output temperature detection data, the A/D output temperature detection data can be smoothed. Thereby, highly accurate temperature detection data can be obtained (for example, noise is reduced), and highly accurate temperature compensation processing can be performed by using the temperature detection data (that is, an error of an oscillation frequency due to an error of the temperature detection data is reduced). Meanwhile, a signal delay corresponding to frequency characteristics occurs during the digital filter processing. Accordingly, time may be taken to stabilize an oscillation frequency when a circuit device is activated. In this regard, according to the aspect of the invention, the A/D output temperature detection data is selected by a selector during an activation period, and thus, the A/D output temperature detection data which does not pass through a digital filter can be used for temperature compensation processing. Thereby, it is possible to stabilize the oscillation frequency in a short time when the circuit device is activated.

In the aspect of the invention, the A/D conversion circuit may perform a given number of A/D conversion during the activation period, and during the normal operation period after the given number of A/D conversion ends, the selector may select the filter output temperature detection data to output as the selector output temperature detection data.

With this configuration, a given number of A/D conversion is performed during an activation period in which the A/D output temperature detection data is selected by a selector, and the A/D output temperature detection data can be input to a digital filter. Thereby, the digital filter can start digital filter processing and can output filter output temperature detection data. The selector selects the filter output temperature detection data during a normal operation period after the given number of A/D conversion is completed, and thereby, temperature compensation processing can be performed based on the temperature detection data for which digital filter processing is completed.

In the aspect of the invention, the digital filter may perform the digital filter processing by using the A/D output temperature detection data that is obtained by the A/D conversion during the activation period as an initial value.

With this configuration, digital filter processing is performed by using A/D output temperature detection data obtained by performing A/D conversion of a temperature detection voltage as an initial value, and thereby, data corresponding to a temperature approximately equal to an actual temperature can be initially output as digital filter processing result data. Thereby, it is possible to stabilize an oscillation frequency at a high speed (for example, a frequency drift is converged within a defined range at a high speed).

In the aspect of the invention, the A/D conversion circuit may output a mode control signal for switching an operation of the selector, and the selector may select the A/D output temperature detection data during the activation period, based on the mode control signal, and may select the filter output temperature detection data during the normal operation period.

With this configuration, an operation of a selector can be controlled based on a mode control signal output from an A/D conversion circuit. That is, it is possible to switch between a selection of A/D output temperature detection data and a selection of filter output temperature detection data in conjunction with the operation, based on the mode control signal for controlling the operation of the A/D conversion circuit. For example, it is possible to perform the switching during a normal operation period after an A/D conversion circuit starts outputting A/D conversion result data.

In the aspect of the invention, the A/D conversion circuit may perform an A/D conversion using a first A/D conversion method during the activation period and may perform an A/D conversion using a second A/D conversion method different from the first A/D conversion method during the normal operation period.

With this configuration, it is possible to use A/D conversion methods different from each other during an activation period of a circuit device and a subsequent normal operation period, respectively. For example, during the activation period of the circuit device, first A/D conversion result data can be acquired at a high speed by using the first A/D conversion method, and an A/D conversion can be performed by using an appropriate second A/D conversion method according to an application in which the A/D conversion result data is used, during the subsequent normal operation period.

In the aspect of the invention, the A/D conversion circuit may include a register that stores determination result data, a D/A converter that performs a D/A conversion of the determination result data and outputs a D/A conversion voltage, a comparator that compares the temperature detection voltage and the D/A conversion voltage, and a processing circuit that performs determination processing based on a comparison result of the comparator, updates the determination result data based on the determination processing, and obtains the A/D output temperature detection data, the processing circuit may perform the determination processing of the A/D output temperature detection data on an MSB side during a first determination period and may perform the determination processing of the A/D output temperature detection data on an LSB side during a second determination period longer than the first determination period, using the first A/D conversion method, and the processing circuit may obtain the A/D output temperature detection data using the A/D output temperature detection data as an initial value during the activation period using the second A/D conversion method.

A voltage difference to be determined by a comparator is reduced on an LSB side than on an MSB side. According to the aspect of the invention, a longer determination period is provided on the LSB side than on the MSB side, and thus, a highly accurate determination can be made on the LSB side than on the MSB side. Meanwhile, the determination period is shorter on the MSB side than on the LSB side, and thus, it is possible to shorten a period in which an A/D conversion is performed once. Thereby, highly accurate A/D output temperature detection data can be acquired at a high speed during an activation period. By obtaining the A/D output temperature detection data using the A/D output temperature detection data is obtained as an initial value during the activation period by using a second A/D conversion method, and thus, it is possible to start the A/D conversion from the initial value during the normal operation period.

In the aspect of the invention, when a time constant of the digital filter processing is referred to as $\tau$ and an activation stabilization time which is time in which the oscillation frequency reaches the frequency range where a frequency deviation from a nominal oscillation frequency is within ±0.5 ppm is referred to as Ts, Ts<$\tau$ may be satisfied.

For example, in order to reduce a low frequency noise caused by, for example, a flicker noise or the like, a time constant $\tau$ needs to be lengthened (a cutoff frequency is lowered). Since an oscillator is required to be activated at a high speed, there is a case where an activation stabilization time Ts that satisfies Ts<$\tau$ is required, but time may be lengthened in which a frequency drift converges to an allowable range due to a signal delay of digital filter processing. In this regard, according to the aspect of the invention, a selector selects A/D output temperature detection data and uses the A/D output temperature detection data for temperature compensation during an activation period, and thereby, the frequency drift can be converged to the allowable range within the activation stabilization time Ts that satisfies Ts<$\tau$. Thereby, it is possible to stabilize the oscillation frequency in a short time during the activation time of the circuit device.

In the aspect of the invention, when a length of the activation period in which the A/D conversion circuit performs an A/D conversion using the first A/D conversion method is referred to as Tc and a time constant of the digital filter processing is referred to as $\tau$, Tc<$\tau$ may be satisfied.

With this configuration, an A/D conversion is performed by using a first A/D conversion method and A/D output temperature detection data is obtained during an activation period (a length Tc) shorter than a time constant $\tau$ of digital filter processing. Thereby, it is possible to set the A/D output temperature detection data as an initial value of the digital filter processing in a time shorter than the time constant $\tau$ and temperature compensation is performed by temperature detection data based on a temperature detection voltage detected by a temperature sensor in a time shorter than the time constant $\tau$.

Accordingly, it is possible to stabilize an oscillation frequency in an activation stabilization time Ts that satisfies Ts<$\tau$.

Another aspect of the invention relates to an oscillator including the circuit device described above.

Still another aspect of the invention relates to an electronic apparatus including the circuit device described above.

Still another aspect of the invention relates to a vehicle including the circuit device described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments according to the invention will be described in detail. The embodiments which will be described below does not unduly limit content of the the invention described in the appended claims, and all the configurations described in the embodiments are not indispensable as means for solving the problem in the invention.

1. Circuit Device

Figure 1:
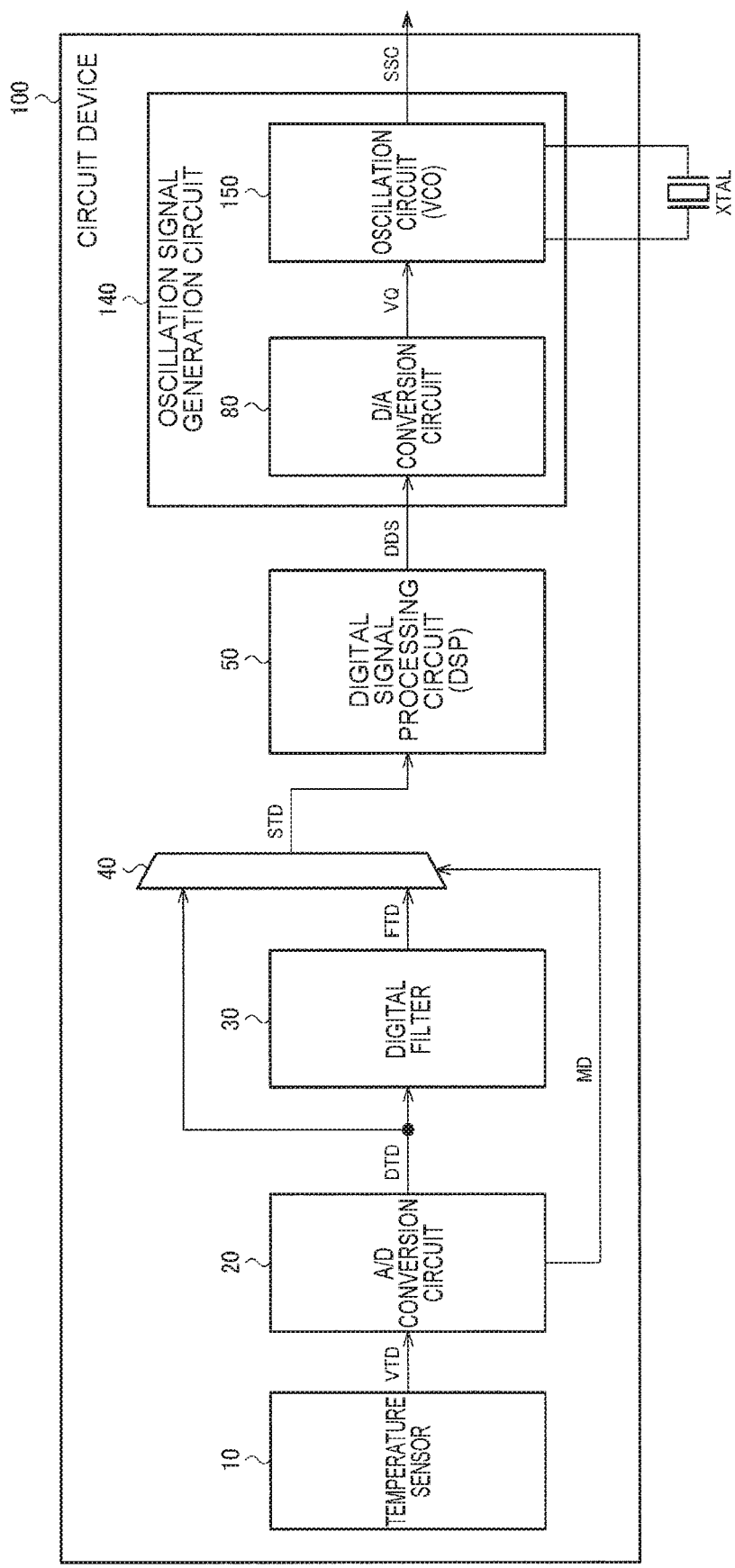
FIG. 1 illustrates a configuration example of a circuit device according to an embodiment.

FIG. 1 illustrates a configuration example of a circuit device 100 according to the embodiment. The circuit device 100 is a circuit device (integrated circuit device, semiconductor chip) that realizes a digital oscillator such as a TCXO or an oven controlled crystal oscillator (OCXO). For example, the digital oscillator can be realized by containing the circuit device and an oscillator element XTAL in a package.

The circuit device 100 includes a temperature sensor 10, an A/D conversion circuit 20, a digital filter 30, a selector 40, a digital signal processing circuit 50 (DSP), and an oscillation signal generation circuit 140. The present embodiment is not limited to the configuration of FIG. 1, and various modifications such as omitting a part of configuration elements thereof and adding other configuration elements can be made. For example, a temperature sensor may be provided outside the circuit device 100, and a temperature detection voltage may be input from the temperature sensor to the circuit device 100.

The temperature sensor 10 outputs a temperature detection voltage VTD. Specifically, the temperature sensor outputs a temperature-dependent voltage that changes depending on a temperature of environment (for example, a circuit device or an oscillator element) as the temperature detection voltage VTD. For example, the temperature sensor 10 generates a temperature-dependent voltage by using a circuit element with a temperature dependency, and outputs a temperature-dependent voltage with reference to a temperature-independent voltage (for example, a band gap reference voltage). For example, a forward voltage of a PN junction is output as the temperature-dependent voltage.

The A/D conversion circuit 20 performs an A/D conversion of the temperature detection voltage VTD from the temperature sensor 10, and outputs A/D output temperature detection data DTD, based on A/D conversion result data. For example, the A/D conversion circuit outputs the A/D conversion result data as the A/D output temperature detection data DTD. For example, a successive approximation method or a method similar to the successive approximation method can be adopted as the A/D conversion method. The A/D conversion method is not limited to such a method, and various methods (a counting type, a parallel comparison type, a series parallel type, and the like) can be adopted.

The digital filter 30 smooths the A/D output temperature detection data DTD through digital filter processing, and outputs the smoothed data as filter output temperature detection data FTD. For example, the digital filter 30 is a low-pass filter configured with an IIR filter. Alternatively, the digital filter may be configured with a FIR filter. The number of bits of the filter output temperature detection data FTD is larger than the number of effective bits (ENOB) of the A/D conversion circuit 20. A cutoff frequency of the digital filter 30 is set according to frequency characteristics of noise of the A/D conversion circuit 20, accuracy of the temperature detection data necessary for temperature compensation processing, followability of temperature compensation to a temperature change, and the like. For example, in a case where the noise of the A/D conversion circuit 20 is caused by flicker noise (l/f noise), the cutoff frequency is set to a low frequency (for example, 0.1 to 10 Hz). The digital filter 30 may be configured as a circuit separate from the digital signal processing circuit 50 (DSP), or may be realized by time division processing of the DSP together with the digital signal processing circuit 50.

The selector 40 selects either the A/D output temperature detection data DTD or the filter output temperature detection data FTD, and outputs the selected data as selector output temperature detection data STD. Specifically, the selector selects the A/D output temperature detection data DTD during an activation period and selects the filter output temperature detection data FTD during a normal operation period (an operation period other than the activation period). The activation period is a period given after the circuit device 100 is activated. The given period may be a period measured and determined by a timer or the like or may be a period determined by a circuit operation of the A/D conversion circuit 20 or the like. For example, the given period may be a period in which the A/D conversion circuit 20 performs an A/D conversion for a given number of times after the circuit device 100 is activated or may be a period from time when the circuit device 100 is activated to time when the digital filter 30 outputs first filter output temperature detection data FTD. FIG. 1 illustrates a case where the selector 40 performs a selection, based on a mode control signal MD output from the A/D conversion circuit 20, but the present embodiment is not limited thereto. For example, the circuit device 100 may include a control circuit (for example, a timer or the like) which is not illustrated, and the control circuit may control the selector 40. The selector 40 may be configured as a separate circuit from the digital signal processing circuit 50 (DSP) and may be realized by time division processing of the DSP together with the digital signal processing circuit 50.

The digital signal processing circuit 50 performs various types of signal processing. For example, the digital signal processing circuit 50 (temperature compensation unit) performs temperature compensation processing of compensating for temperature characteristics of an oscillation frequency of the oscillator element XTAL, based on the selector output temperature detection data STD, and outputs frequency control data DDS for controlling the oscillation frequency. Specifically, the digital signal processing circuit 50 performs temperature compensation processing for canceling or suppressing (keeping an oscillation frequency constant even in a case where there is a temperature change) a fluctuation of an oscillation frequency due to a temperature change, based on the selector output temperature detection data STD (temperature-dependent data) that changes depending on a temperature, coefficient data (coefficient data of an approximation function) for temperature compensation processing, and the like. That is, the frequency control data DDS is obtained by inserting the selector output temperature detection data STD into the approximate function that cancels or suppresses the fluctuation of the oscillation frequency due to the temperature change. The digital signal processing circuit 50 is a digital signal processor (DSP) that performs various types of signal processing including the temperature compensation processing in a time division manner. Alternatively, the digital signal processing circuit 50 may be realized by an ASIC circuit such as a gate array or may be realized by a processor (for example, a CPU, an MPU, or the like) and a program operating in the processor.

The oscillation signal generation circuit 140 generates an oscillation signal SSC. For example, the oscillation signal generation circuit 140 generates the oscillation signal SSC of an oscillation frequency set by the frequency control data DDS by using the frequency control data DDS and the oscillator element XTAL. For example, the oscillation signal generation circuit 140 oscillates the oscillator element XTAL at the oscillation frequency set by the frequency control data DDS to generate the oscillation signal SSC.

The oscillation signal generation circuit 140 can include a D/A conversion circuit 80 and an oscillation circuit 150. However, the oscillation signal generation circuit 140 is not limited to such a configuration, and various modifications such as omitting a part of configuration element thereof and adding other configuration element can be made.

The D/A conversion circuit 80 performs D/A conversion of the frequency control data DDS and outputs an output voltage VQ corresponding to the frequency control data DDS. For example, a resistor string type (resistor division type) can be adopted as the D/A conversion method of the D/A conversion circuit 80. However, the D/A conversion method is not limited to this, and various methods such as a resistor ladder type (R-2R ladder type or the like), a capacitor array type, a pulse width modulation type, or the like can be adopted. In addition to a D/A converter, the D/A conversion circuit 80 can include a control circuit, a modulation circuit, a filter circuit, and the like.

The oscillation circuit 150 generates the oscillation signal SSC by using the output voltage VQ of the D/A conversion circuit 80 and the oscillator element XTAL. The oscillation circuit 150 is connected to the oscillator element XTAL via first and second vibrator terminals (vibrator pads). For example, the oscillation circuit 150 generates the oscillation signal SSC by oscillating the oscillator element XTAL (a piezoelectric vibrator, a resonator, or the like). Specifically, the oscillation circuit 150 oscillates the oscillator element XTAL at an oscillation frequency being generated by using the output voltage VQ of the D/A conversion circuit 80 as a frequency control voltage (oscillation control voltage). For example, in a case where the oscillation circuit 150 is a circuit (VCO) that controls the oscillation of the oscillator element XTAL under a voltage control, the oscillation circuit 150 can include a variable capacitor (varicap or the like) whose capacitance value changes depending on the frequency control voltage. The oscillation circuit 150 is, for example, a Pierce type oscillation circuit in which an oscillator is connected to a feedback loop between a base and an emitter of a bipolar transistor or between a collector and the base of the bipolar transistor. Alternatively, the oscillation circuit 150 is an oscillation circuit in which an oscillator is connected to a feedback loop between an input and an output of odd-numbered inverters (a logic inversion circuit).

The oscillation signal generation circuit 140 may be a circuit that generates the oscillation signal SSC by using a direct digital synthesizer method. For example, the oscillation signal SSC of the oscillation frequency set by the frequency control data DDS may be digitally generated by using the oscillation signal of the oscillator element XTAL (an oscillation source of a fixed oscillation frequency) as a reference signal.

The oscillator element XTAL is, for example, a piezoelectric vibrator. Specifically, the oscillator is, for example, a quartz crystal vibrator. For example, the quartz crystal vibrator is a vibrator whose cut angle vibrates in thickness such as AT cut or SC cut. For example, the oscillator is a vibrator embedded in a temperature compensated crystal oscillator (TCXO) not including a constant temperature oven. Alternatively, the oscillator may be a vibrator or the like embedded in an oven-controlled crystal oscillator (OCXO) including the constant temperature oven. In addition, a surface acoustic wave (SAW) resonator, a micro electro mechanical systems (MEMS) vibrator serving as a silicon vibrator formed by using a silicon substrate, or the like may be adopted as the oscillator.

In FIG. 1, the oscillation signal SSC is output to the outside of the circuit device 100, but the circuit device 100 may further include a buffer circuit. The buffer circuit performs buffering of the oscillation signal SSC and outputs the buffered signal to the outside of the circuit device 100. In addition, the circuit device 100 may further include a memory such as a nonvolatile memory. The memory stores a coefficient of an approximate expression (polynomial) used in temperature compensation processing. For example, temperature characteristics of an oscillation frequency are measured by a test device in a pre-shipment inspection of an oscillator or the like, the test device obtains a coefficient of a polynomial based on the measured temperature characteristics, and the coefficient is written to a memory by the test device.

According to the above-described embodiment, the A/D conversion circuit 20 performs A/D conversion of a temperature detection voltage VTD from the temperature sensor 10 and outputs data for which the A/D conversion is completed as the A/D output temperature detection data DTD. The digital filter 30 performs digital filter processing of the A/D output temperature detection data DTD and outputs the data in which the digital filter processing is completed as the filter output temperature detection data FTD. The selector 40 selects the A/D output temperature detection data DTD during the activation period to outputs as the selector output temperature detection data STD, and selects the filter output temperature detection data FTD during a normal operation period after the activation period to output as the selector output temperature detection data STD. The digital signal processing circuit 50 performs the temperature compensation processing of the oscillation frequency based on the selector output temperature detection data STD and outputs the frequency control data DDS of the oscillation frequency.

The oscillation signal generation circuit 140 generates an oscillation signal SSC of the oscillation frequency set by the frequency control data DDS from the digital signal processing circuit 50.

Here, the activation period is an activation period of the circuit device 100. For example, the activation period is a given period since the circuit device 100 is powered on (the power supply voltage rises). Alternatively, the activation period is a given period after resetting of the circuit device 100 is released. Alternatively, the activation period is a given period after the resetting of each unit (for example, the A/D conversion circuit 20, the oscillation signal generation circuit 140, and the like) of the circuit device 100 is released.

According to the present embodiment, the digital filter 30 performs the digital filter processing of the A/D output temperature detection data DTD, and thereby, the A/D output temperature detection data DTD can be smoothed (noise is reduced). Thereby, highly accurate temperature detection data can be obtained, and highly accurate temperature compensation processing can be performed by using the temperature detection data (that is, an error of the oscillation frequency due to an error of the temperature detection data is reduced). For example, in a case where the successive approximation type A/D conversion circuit is adopted, the A/D conversion accuracy is around 12 bits, but in order to make the oscillation frequency highly accurate (for example, to make a high C/N ratio of the oscillation signal), A/D conversion accuracy higher than that may be required in some case. Alternatively, there is a demand to lower the power supply voltage so as to reduce power consumption of the circuit device 100, but it may be difficult to increase the A/D conversion accuracy. Even in this case, the A/D conversion accuracy can be substantially increased through the digital filter processing, according to the present embodiment.

Meanwhile, during the digital filter processing, a signal delay (delay of a time constant corresponding to a cutoff frequency) corresponding to the frequency characteristics occurs. Accordingly, when the circuit device 100 is activated, a delay occurs until the filter output temperature detection data FTD converges to data of a correct temperature (temperature measured by the temperature sensor 10), and time may be required until the oscillation frequency is stabilized. In this regard, according to the present embodiment, the selector 40 selects the A/D output temperature detection data DTD during the activation period, and thereby, the A/D output temperature detection data DTD which does not pass through the digital filter 30 is used for the temperature compensation processing. Thereby, it is possible to stabilize the oscillation frequency in a short time when the circuit device 100 is activated. For example, activation time is defined in specifications, and it is necessary for the oscillation frequency to be stabilized within a predetermined error range with respect to a nominal oscillation frequency within the activation time. In the present embodiment, it is possible to stabilize the oscillation frequency within, for example, the activation time defined in the specifications.

Figure 2:
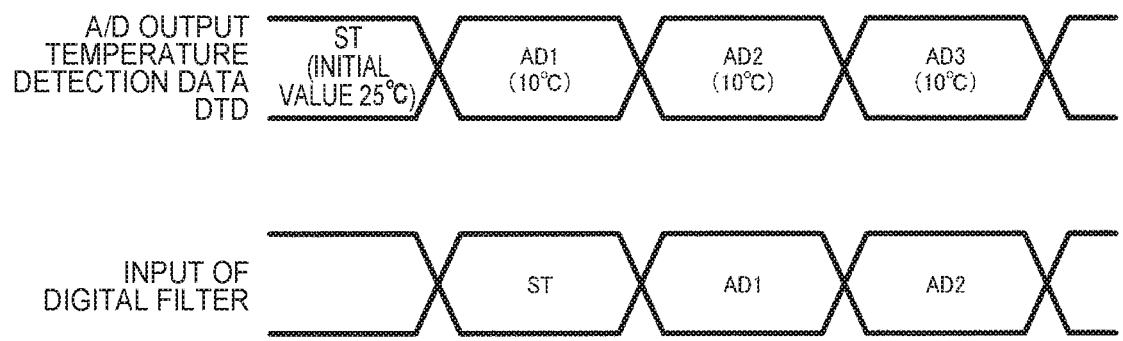
FIG. 2 is a diagram illustrating an operation in a case where filter output temperature detection data is used for temperature compensation processing from activation time without providing a selector.
Figure 3:
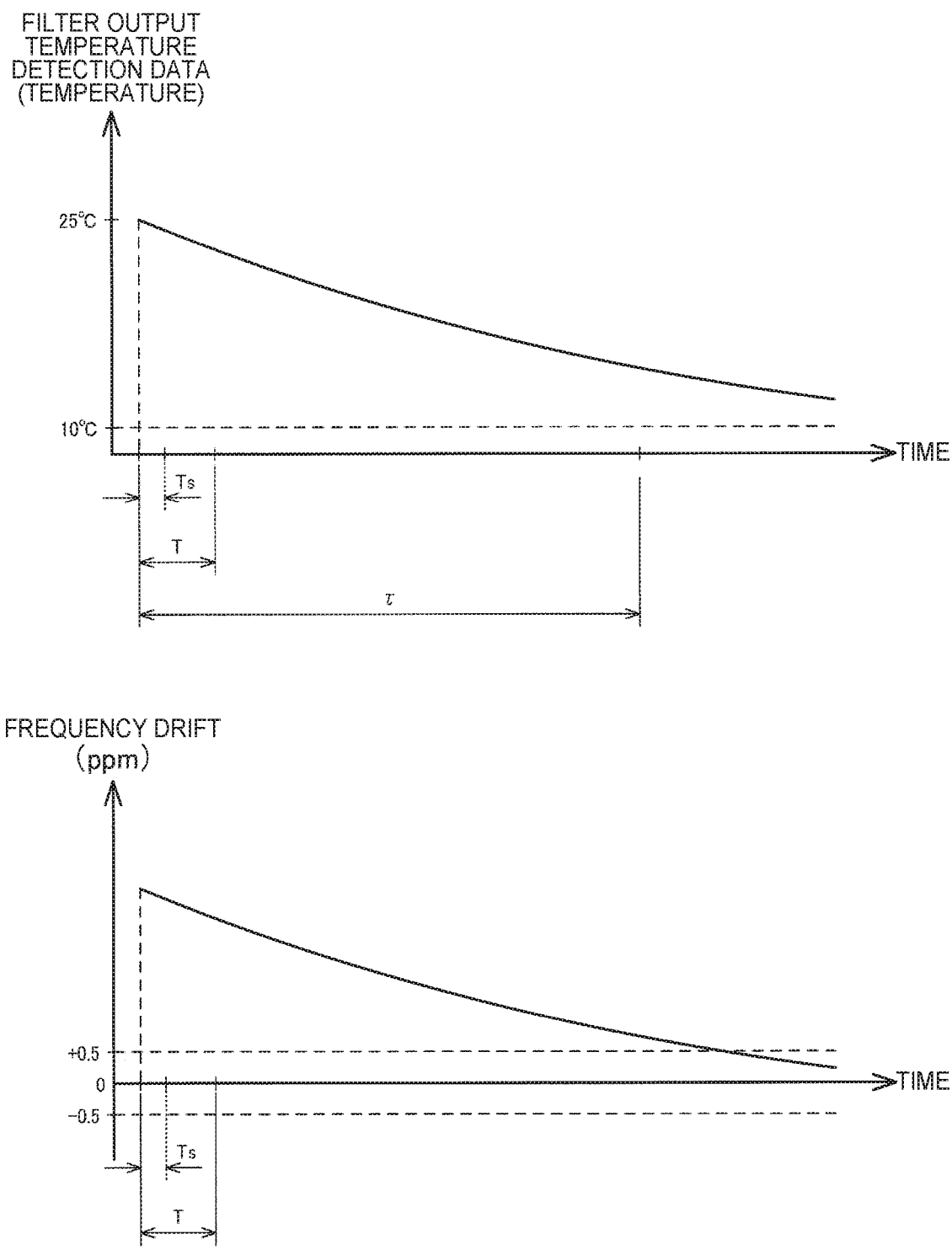
FIG. 3 is a diagram illustrating the operation in the case where the filter output temperature detection data is used for the temperature compensation processing from the activation time without providing the selector.

Hereinafter, the above points will be described in detail with reference to the drawings. FIGS. 2 and 3 are diagrams illustrating an operation in a case where the selector 40 is not provided and the filter output temperature detection data FTD is used for the temperature compensation processing from the activation time.

As illustrated in FIG. 2, the A/D conversion circuit 20 outputs an initial value ST as the A/D output temperature detection data DTD when the circuit device 100 is activated. For example, the initial value ST represents a reference temperature (25 degrees Celsius). For example, in a case where the temperature detected by the temperature sensor 10 is 10 degrees Celsius, data AD1, AD2, and AD3 representing 10 degrees Celsius are sequentially output as the A/D output temperature detection data DTD. The data AD1, AD2, and AD3 include variation due to an A/D conversion error (noise).

In a case where the filter output temperature detection data FTD is used for the temperature compensation processing from the activation time, the initial value ST and the data AD1, AD2, and AD3 are sequentially input to the digital filter 30. The digital filter 30 performs digital filter processing of the input data and outputs the filter output temperature detection data FTD. The reason why the initial value ST is input to the digital filter 30 is that the activation time defined in the oscillator specification is as short as, for example, 2 ms. That is, it is necessary for the digital filter 30 to output some kind of temperature detection data within the activation time. Since a change in an environmental temperature is generally slow, an A/D conversion rate is also relatively low (for example, several hundred Hz to several kHz) correspondingly. Accordingly, if it is waited for the first A/D conversion result data AD1 to be output, the digital filter 30 may not be able to start outputting within the activation time, and thereby, the initial value ST is input to the digital filter 30.

FIG. 3 schematically illustrates time change characteristics of the filter output temperature detection data FTD (temperature represented by the FTD) and time change characteristics of a frequency drift of the oscillation frequency in which temperature is compensated by using the filter output temperature detection data FTD.

Since the initial value ST corresponding to 25 degrees Celsius is input to the digital filter 30 when the circuit device 100 is activated, the filter output temperature detection data FTD becomes data corresponding to 25 degrees Celsius. Thereafter, data (AD1, and the like) corresponding to the actual temperature of 10 degrees Celsius is input to the digital filter 30, and thereby, the filter output temperature detection data FTD gradually approaches (is converged) to data corresponding to 10 degrees Celsius with a time constant τ of the digital filter processing.

It is considered that the frequency drift of the oscillation frequency in which the temperature is compensated by using the filter output temperature detection data FTD gradually approaches (is converges) to 0 ppm with a time constant which is the same as the time constant τ of the digital filter processing. For example, in a case where the digital filter 30 performs the low-pass filter processing with a cutoff frequency of 1 Hz, τ=137 ms, which is much longer than a general activation time specification 2 ms=T. Accordingly, it takes a time longer than the activation time T=2 ms until the frequency drift reaches a specification range (for example, −0.5 ppm to +0.5 ppm). As described above, the activation time is the time defined in the specifications, and if it is assuming that time (hereinafter, referred to as activation stabilization time) until the frequency drift is stabilized in the specification range is Ts in actual, it is necessary to satisfy Ts≤T. In a case of the operation described with reference to FIG. 3, the time constant τ is long, and thus, there is a possibility that Ts≤T may not be satisfied.

As described above, in a case where a difference between the temperature (ambient temperature) measured by the temperature sensor 10 and the temperature corresponding to the initial value ST of the A/D output temperature detection data DTD is large, if an output of the digital filter 30 is used for the temperature compensation processing from the activation time, the specification of the oscillation frequency stabilization time (activation time) may not be satisfied.

Figure 4:
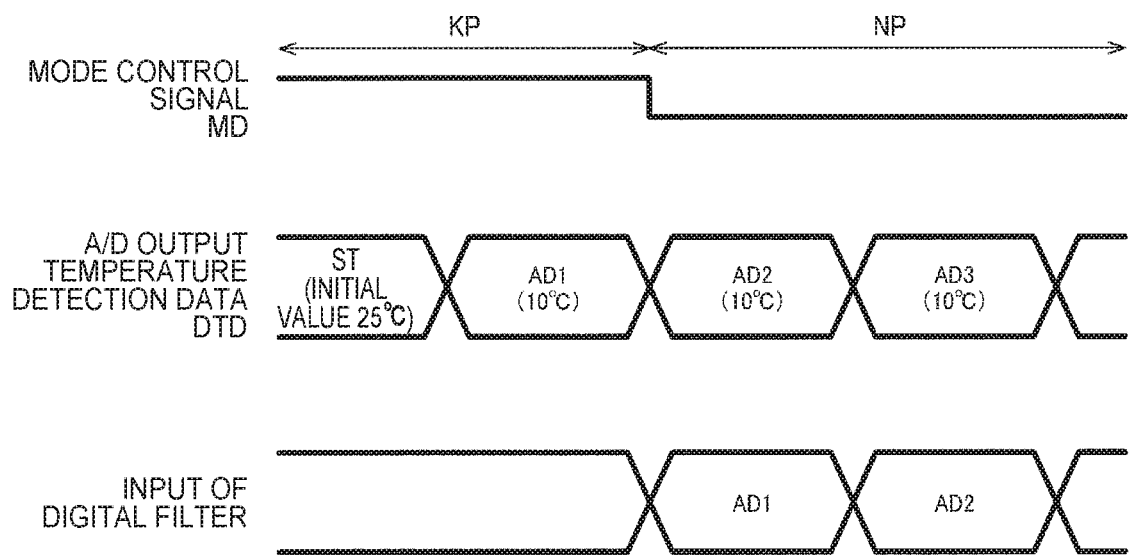
FIG. 4 is a diagram illustrating an operation of the circuit device according to the embodiment.
Figure 5:
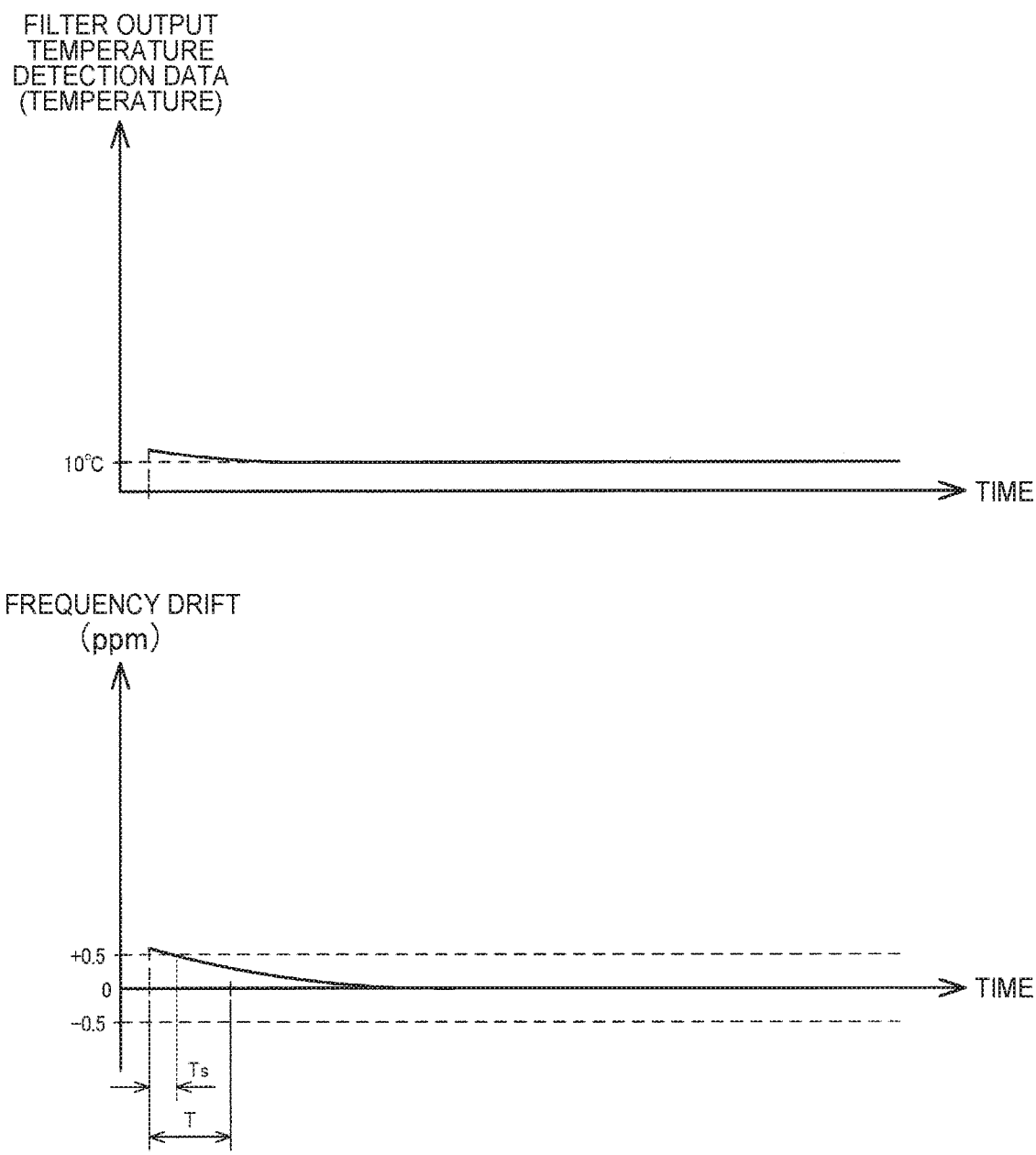
FIG. 5 is a diagram illustrating the operation of the circuit device according to the embodiment.

FIGS. 4 and 5 are diagrams illustrating the operation of the circuit device 100 according to the present embodiment. As illustrated in FIG. 4, in the present embodiment, the initial value ST (25 degrees Celsius) is not input (taken in) to the digital filter 30, and the A/D conversion result data, AD1, AD2, and AD3 (10 degrees Celsius) are sequentially input to the digital filter 30. The digital filter 30 performs the digital filter processing of the input data and outputs the filter output temperature detection data FTD.

The A/D conversion circuit 20 outputs a mode control signal MD that defines an activation period KP. For example, the mode control signal MD is at a high level (first logic level, active) during the activation period KP and the mode control signal MD is at a low level (second logic level, inactive) during a normal operation period NP. The selector 40 selects the A/D output temperature detection data DTD when the mode control signal MD is at a high level, and selects the filter output temperature detection data FTD when the mode control signal MD is at a low level.

As will be described below, the A/D conversion circuit 20 performs the A/D conversion in a high speed mode (first A/D conversion method) during the activation period KP, and performs the A/D conversion in a normal operation mode (second A/D conversion method) during the normal operation period NP. The A/D conversion circuit 20 outputs a signal for setting the A/D conversion method as a mode control signal MD. For example, the A/D conversion of a given number of times after the circuit device 100 is activated is performed by using the first A/D conversion method. The A/D conversion circuit 20 performs the A/D conversion of a given number of times before the activation time (T of FIG. 5, a stable time of the oscillation frequency) defined in the specifications elapses and outputs the A/D conversion result data. For example, the mode control signal MD is at a low level before the activation time T elapses. In this case, a length of the activation period KP is less than or equal to the activation time T. Although FIG. 4 illustrates a case where the A/D conversion is performed once during the activation period KP, the present embodiment is not limited thereto, and the A/D conversion may be performed twice or more during the activation period KP. That is, the given number of times is one or more. In the A/D conversion of the given number of times, the A/D conversion is performed by using the first A/D conversion method. In a case where the A/D conversion is performed twice or more during the activation period KP, for example, the A/D output temperature detection data obtained by the last A/D conversion is set in the digital filter 30 as an initial value.

FIG. 5 schematically illustrates the time change characteristics of the filter output temperature detection data FTD (temperature represented by FTD) in the present embodiment, and the time variation characteristics of the frequency drift of the oscillation frequency in which the temperature is compensated by using the selector output temperature detection data STD.

When the circuit device 100 is activated, the initial value ST corresponding to 25 degrees Celsius is not input to the digital filter 30, and the data (AD1 and the like) corresponding to the actual temperature of 10 degrees Celsius is input to the digital filter. Accordingly, even if there is an error in the A/D conversion during the activation period, the digital filter 30 starts the digital filter processing from the input data corresponding to the temperature significantly close to the actual temperature.

During the activation period KP of the circuit device 100, the A/D output temperature detection data (AD1 in FIG. 4) is selected by the selector 40, and the temperature compensation processing is performed based on the A/D output temperature detection data corresponding to the actual temperature of 10 degrees Celsius. Accordingly, it is possible to converge the frequency drift to the specification range (for example, −0.5 ppm to +0.5 ppm) before the activation time T defined in the specifications elapses. That is, the activation stabilization time Ts, which is time in which the frequency drift is actually stabilized within the specification range, satisfies Ts≤T.

During the normal operation period NP after the activation period KP, the filter output temperature detection data is selected by the selector 40. As described above, since the digital filter processing starts from the input data corresponding to the temperature significantly close to the actual temperature, the filter output temperature detection data becomes data corresponding to the temperature significantly close to the actual temperature of 10 degrees Celsius at the start of the normal operation period NP. Accordingly, after the oscillation frequency is stabilized during the activation period KP, it is possible to maintain the frequency drift within the specification range (for example, −0.5 ppm to +0.5 ppm) also during the normal operation period NP. In addition, since the A/D output temperature detection data is smoothed through the digital filter processing, it is possible to perform the temperature compensation processing, based on the highly accurate temperature detection data. Thereby, a highly accurate oscillation frequency (low-noise oscillation signal) is obtained during the normal operation period NP.

According to the embodiment described above, the A/D conversion circuit 20 performs the A/D conversion for a given number of times (once or more times) during the activation period KP, and the selector 40 selects the filter output temperature detection data FTD to outputs as the selector output temperature detection data STD during the normal operation period NP after the A/D conversion for a given number of times is completed.

By doing so, the A/D conversion of a given number of times is performed during the activation period KP in which the A/D output temperature detection data is selected by the selector 40, and the A/D output temperature detection data (AD1 of FIG. 4) can be input to the digital filter 30. Thereby, the digital filter 30 starts the digital filter processing and can output the filter output temperature detection data. The selector 40 selects the filter output temperature detection data FTD during the normal operation period NP after the A/D conversion of the given number of times is completed, and thereby, the temperature compensation processing can be performed based on the temperature detection data for which digital filter processing is completed.

In the present embodiment, the digital filter 30 performs the digital filter processing by using the A/D output temperature detection data DTD obtained by performing the A/D conversion during the activation period KP as an initial value.

Here, the initial value of the digital filter processing is the first data of time series data processed during the digital filter processing. Specifically, the initial value is data that is initially set to delay elements ($Z^{-1}$, registers, for example, DLA1 and DLB1 in FIG. 6) of the digital filter processing. For example, the A/D output temperature detection data obtained by the last A/D conversion among the A/D conversions of the given number of times during the activation period KP is set to the digital filter 30 as the initial value. The present embodiment is not limited to this, and in a case where the given number of times is 2 or more, an average value or the like of a plurality of pieces of the A/D output temperature detection data obtained by the A/D conversion of the given number of times during the activation period KP may be set to the digital filter 30 as the initial value.

By doing so, since the digital filter processing is performed by using the A/D output temperature detection data DTD obtained by performing A/D conversion of the temperature detection voltage VTD as the initial value, data corresponding to a temperature approximately equal to the actual temperature can be output from the beginning as a result data of the digital filter processing. Thereby, it is possible to stabilize the oscillation frequency within the activation stabilization time Ts less than or equal to the activation time T, even during the digital filter processing in which the time constant τ is longer than the activation time T defined in the specifications.

In addition, in the present embodiment, the A/D conversion circuit 20 outputs the mode control signal MD for switching between the activation period KP and the normal operation period NP. The selector 40 selects the A/D output temperature detection data DTD during the activation period KP and selects the filter output temperature detection data FTD during the normal operation period NP, based on the mode control signal MD.

By doing so, the operation of the selector 40 can be controlled based on the mode control signal MD output from the A/D conversion circuit 20. That is, it is possible to switch selection of the A/D output temperature detection data DTD and selection of the filter output temperature detection data FTD in conjunction with the operation, based on the mode control signal MD for controlling the operation of the A/D conversion circuit 20. For example, after the A/D conversion circuit 20 starts outputting the A/D conversion result data (AD1 and the like) (that is, after inputting the A/D conversion result data to the digital filter 30 is started), it is possible to perform switching to the normal operation period NP.

In addition, in the present embodiment, when a time constant of the digital filter processing is referred to as τ and the activation stabilization time which is the time until the oscillation frequency reaches a frequency range in which a frequency deviation from the nominal oscillation frequency is within ±0.5 ppm is referred to as Ts, Ts<τ is satisfied. The range of the frequency deviation is not limited to a range within ±0.5 ppm. That is, the activation stabilization time Ts may be the time when the oscillation frequency reaches a range in which the frequency deviation from the nominal oscillation frequency is within a given deviation range.

Here, when the cutoff frequency during the digital filter processing (low-pass filter processing) is fc, the time constant τ can be obtained from fc=1/(2π×τ). For example, the frequency deviation of ±0.5 ppm is an allowable range of the frequency drift defined in the specifications of the circuit device 100. The time until the frequency drift is stabilized in the allowable range of this frequency drift after the circuit device 100 is activated is the activation stabilization time Ts. In addition, for example, the specifications require that the frequency drift is stabilized within the allowable range of the frequency drift (that is, Ts≤T) within the activation time T after the circuit device 100 is activated.

For example, it is necessary to lengthen the time constant τ (the cutoff frequency fc is lowered) so as to reduce noise of a low frequency caused by a flicker noise or the like. Since the oscillator is required to be activated at a high speed, the time constant τ that satisfies T<τ may be required. As described with reference to FIG. 3, when T<τ, the frequency drift may not be converged within the allowable range of the frequency drift in the activation time T by the signal delay during the digital filter processing. In this regard, according to the present embodiment, the selector 40 selects the A/D output temperature detection data DTD during the activation period KP and uses the A/D output temperature detection data DTD for temperature compensation, and thus, it is possible to reduce the activation stabilization time Ts (Ts≤T is satisfied) and to converge the frequency drift within the allowable range in the activation time T.

In addition, in the present embodiment, when a length of the activation period KP during which the A/D conversion circuit 20 performs A/D conversion by using the first A/D conversion method is referred to as Tc, Tc<τ is satisfied. Specifically, even in a case where Tc≤Ts, Tc≤Ts<τ is satisfied.

The first A/D conversion method is, for example, an A/D conversion method in a high speed mode which will be described below with reference to FIGS. 9 and 10. During the normal operation period NP, the A/D conversion circuit 20 performs the A/D conversion by using a second A/D conversion method. The second A/D conversion method is, for example, an A/D conversion method in a normal operation mode which will be described below with reference to FIG. 8.

By doing so, the A/D conversion is performed by the first A/D conversion method during the activation period KP (length Tc) shorter than the time constant τ of the digital filter processing, and the A/D output temperature detection Data DTD is obtained. Thereby, it is possible to set the A/D output temperature detection data DTD as the initial value of the digital filter processing in a time shorter than the time constant τ, and a temperature compensation is performed by the temperature detection data, based on the temperature detection voltage VTD detected by the temperature sensor 10 in a time shorter than the time constant τ. Accordingly, it is possible to stabilize the oscillation frequency during the activation stabilization time Ts that satisfies Ts<τ.

In the above embodiments, a case where a method according to the invention is applied to an oscillator is described as an example, but an application target of the invention is not limited to this. That is, the invention can be applied to a circuit device that includes the A/D conversion circuit 20, the digital filter 30, the selector 40, and the digital signal processing circuit, and the digital signal processing circuit performs the digital signal processing based on the selector output temperature detection data STD. For example, a circuit device in which a gyro sensor (angular velocity sensor) drives a sensor element and detects an angular velocity can perform digital signal processing such as zero point correction in which temperature detection data can be used.

2. Digital Filter

Figure 6:
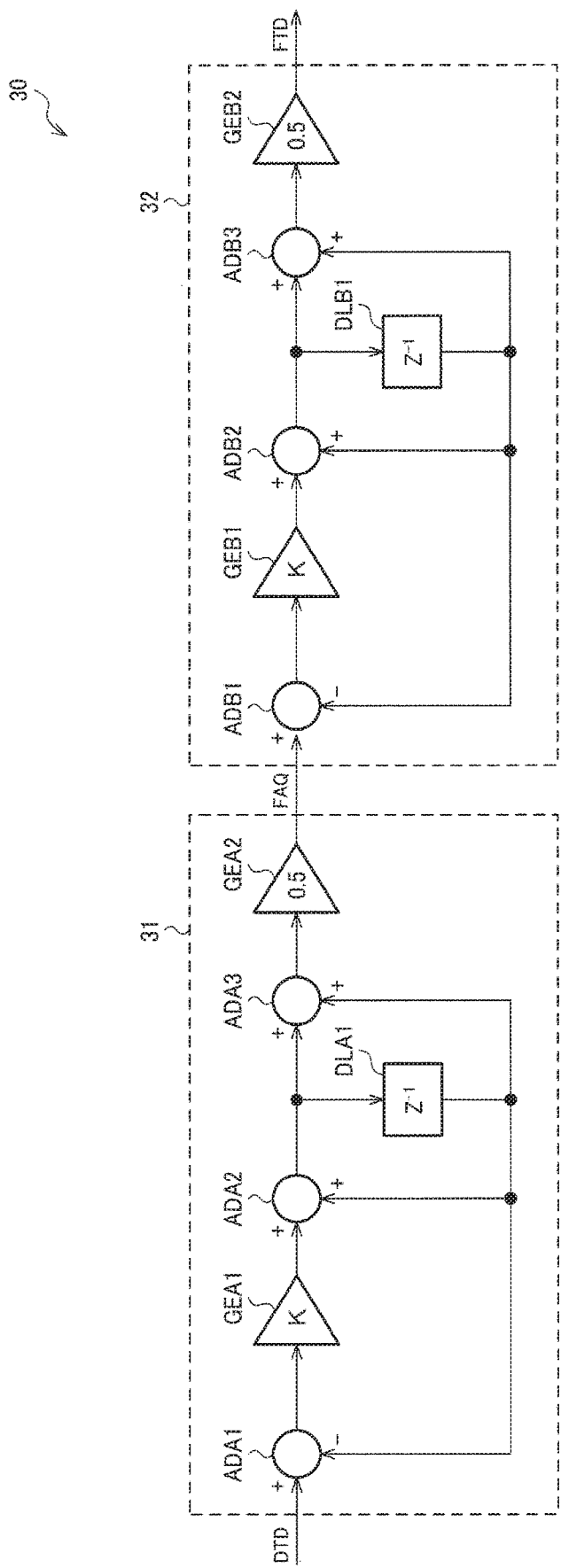
FIG. 6 illustrates a detailed configuration example of a digital filter.

FIG. 6 illustrates a detailed configuration example of the digital filter 30. The digital filter 30 includes a first filter 31 and a second filter 32. The filter 31 includes a subtractor ADA1, adders ADA2 and ADA3, multipliers GEA1 and GEA2, and a delay element DLA1 (register). The filter 32 includes adders ADB1, ADB2, ADB3, multipliers GEB1 and GEB2, and a delay element DLB1 (register).

Each of the filters 31 and 32 is a primary IIR filter. Since the filters 31 and 32 have the same configuration as each other, the filter 31 will be mainly described below as an example. The subtractor ADA1 subtracts output data of the delay element DLA1 from the A/D output temperature detection data DTD which is an input data. The multiplier GEA1 multiplies an output of the subtractor ADA1 by a gain K (K is a given real number). The adder ADA2 adds output data of the multiplier GEA1 to the output data of the delay element DLA1. The delay element DLA1 stores output data of the adder ADA2. The adder ADA3 adds the output data of the adder ADA2 to the output data of the delay element DLA1. The multiplier GEA2 multiplies output data of the adder ADA3 by a gain of 0.5 and outputs the result as data FAQ. The filter 32 performs filter processing which is the same as filter processing of the filter 31 on the data FAQ which is input data, and outputs the result as filter output temperature detection data FTD.

The configuration of the digital filter 30 is not limited to FIG. 6, and any digital filter having low-pass filter characteristics may be used. For example, the filter may be a primary or a tertiary IIR filter or may be an FIR filter.

3. A/D Conversion Circuit

Figure 7:
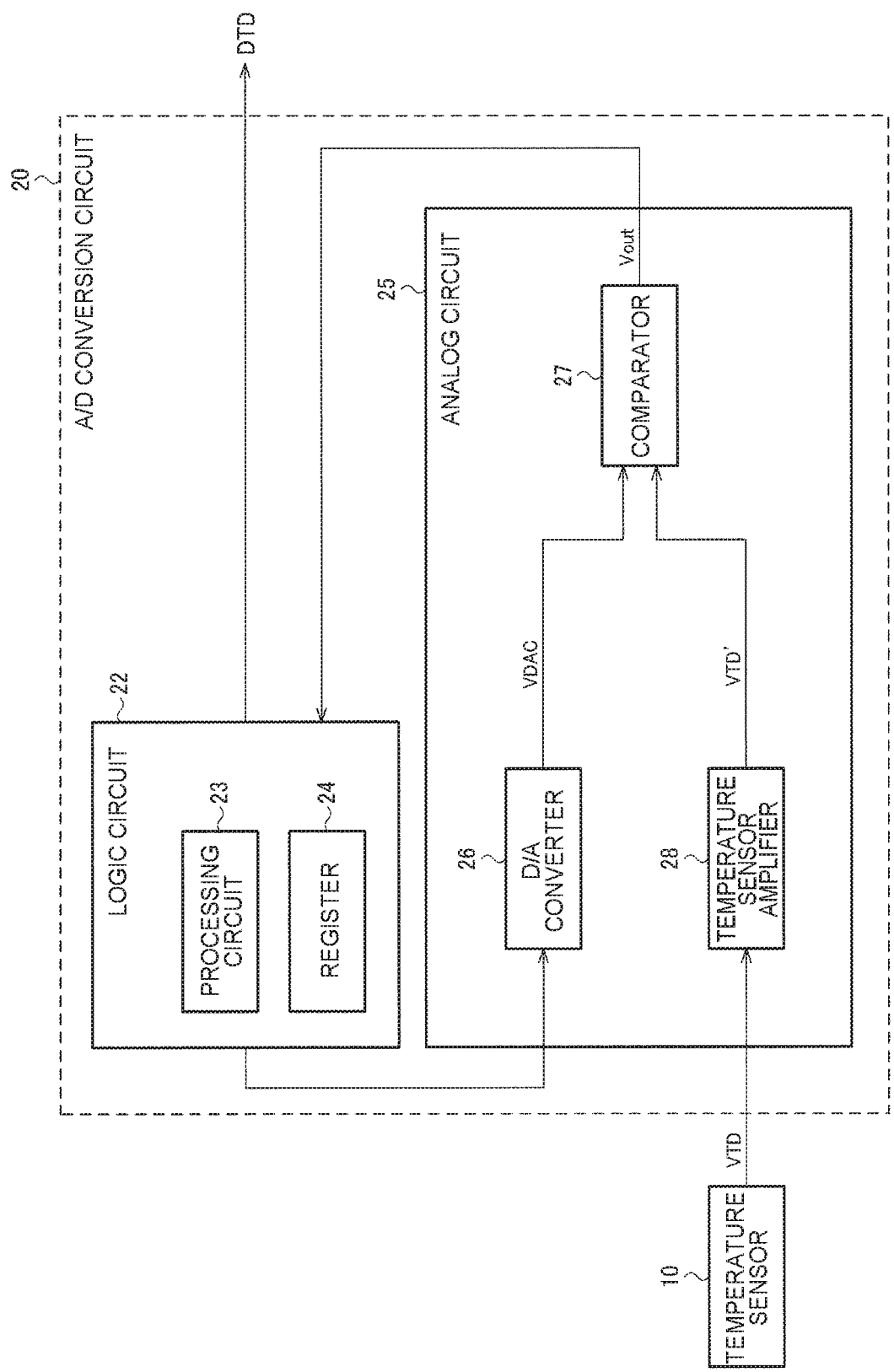
FIG. 7 illustrates a detailed configuration example of an A/D conversion circuit.

FIG. 7 illustrates a detailed configuration example of the A/D conversion circuit 20. The A/D conversion circuit 20 includes a processing circuit 23, a register 24, a D/A converter 26, and a comparator 27. In addition, A/D conversion circuit 20 can include a temperature sensor amplifier 28. The processing circuit 23 and the register 24 are provided as a logic circuit 22, and the D/A converter 26, the comparator 27, and the temperature sensor amplifier 28 are provided as an analog circuit 25 (analog circuit).

The register 24 stores determination result data (result data) such as interim result data and final result data of A/D conversion. The register 24 corresponds to, for example, a successive approximation result register of a successive approximation method. The D/A converter 26 performs D/A conversion of the determination result data of the register 24. Various types of widely known D/A converters can be adopted as the D/A converter 26. For example, a D/A converter of a resistor string type, a resistor ladder type, a capacitor array type or the like can be adopted as the D/A converter 26. The temperature sensor amplifier 28 amplifies the temperature detection voltage VTD from the temperature sensor 10 and outputs the amplified voltage as a temperature detection voltage VTD'. The comparator 27 compares an output voltage (D/A conversion voltage VDAC) of the D/A converter 26 with the temperature detection voltage VTD' (an input voltage in a broad sense). The comparator 27 can be realized by, for example, a chopper type comparator. The invention is not limited to this, and various comparators widely known can be adopted as the comparator 27. The processing circuit 23 performs determination processing based on the comparison result of the comparator 27 and performs update processing of determination result data of the register 24. The final temperature detection data DTD obtained by the update processing is output from the A/D conversion circuit 20 as the A/D conversion result of the temperature detection voltage VTD. With the configuration, it is possible to realize a normal operation mode (normal mode), a high speed mode, or A/D conversion of a general successive approximation method or the like.

In addition, the D/A converter 26 performs D/A conversion of the determination result data for which update processing is completed by the processing circuit 23. Thereby, the determination result data for which update processing is completed can be used as a comparison target with the temperature detection voltage VTD during the next comparison processing. That is, by repeating a cycle of performing the determination processing based on the comparison result, performing the update processing of the determination result data through the determination processing, and using the determination result data for which update processing is completed for the next comparison processing, it is possible to appropriately update the temperature detection data DTD.

Specifically, the comparator 27 may compare a D/A conversion voltage VDAC obtained by converting the previous determination result data using the D/A converter 26 with the temperature detection voltage VTD', and the processing circuit 23 may perform determination processing based on the comparison result and may perform the update processing of updating the determination result data within a range less than or equal to k×LSB. k is an integer of 1 or larger, and, for example, k=1. This corresponds to a normal operation mode which will be described below. Furthermore, in a case where the next timing is used as a reference, the determination result data for which update processing is completed is handled as "previous temperature detection data DTD", and thereby, processing is performed in which the D/A converter 26 performs D/A conversion of the determination result data and outputs the converted data to the comparator 27. By repeating this cycle, it is possible to update the temperature detection data DTD (final result data) within the range less than or equal to k×LSB in the normal operation mode.

Figure 8:
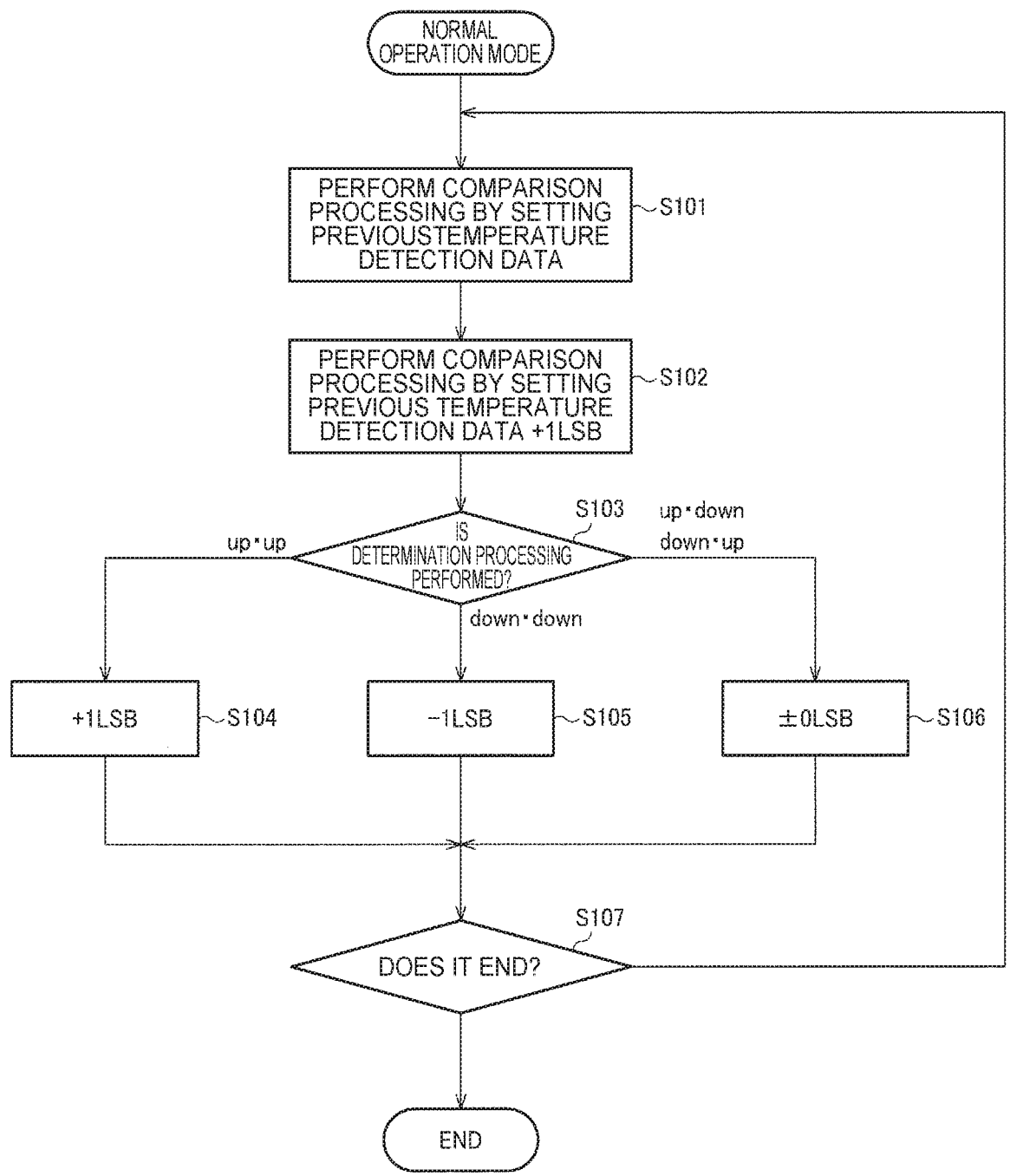
FIG. 8 is a flowchart illustrating processing in a normal operation mode.

Hereinafter, an operation of the A/D conversion circuit 20 in the normal operation mode will be described. FIG. 8 is a flowchart illustrating processing in the normal operation mode. Here, a case where k=1 will be first described as an example. If the normal operation mode starts, the D/A converter 26 first performs D/A conversion of a code of the previous temperature detection data DTD to obtain the D/A conversion voltage VDAC (S101). Then, the comparator 27 compares the D/A conversion voltage VDAC with the temperature detection voltage VTD', and the processing circuit 23 obtains a result (hereinafter, referred to as a first comparison result) of either an up determination or a down determination.

Next, 1 LSB (kLSB) is added to a value of the register 24, that is, a value of the previous temperature detection data DTD, the added data is D/A-converted by the D/A converter 26 to obtain the D/A conversion voltage VDAC (S102). Then, the comparator 27 performs comparison processing (second comparison processing) of the D/A conversion voltage VDAC and the temperature detection voltage VTD', and the processing circuit 23 obtains a result (hereinafter, referred to as a second comparison result) of either the up determination or the down determination.

The processing circuit 23 performs determination processing of determining the current temperature detection data DTD, based on the results of the two pieces of comparison processing (S103).

First, in a case where it is determined that that the temperature detection voltage VTD' is larger than the D/A conversion voltage VDAC by the determination processing based on the first comparison result, that is, in a case where an up determination is obtained and the determination processing based on the second comparison result also results in the up determination, the current final result data is determined as second data, that is, a value obtained by adding 1 LSB (kLSB) to the previous temperature detection data DTD (step S104).

In addition, in a case where it is determined that the temperature detection voltage VTD' is smaller than the D/A conversion voltage VDAC by the determination processing based on the first comparison result, that is, in a case where a down determination is obtained and the determination processing based on the second comparison result also results in the down determination, the current final result data is determined as the data obtained by subtracting 1 LSB (kLSB) from the previous final result data (step S105).

In addition, a case where the result of the determination processing based on the first comparison result is the up determination and the result of the determination processing based on the second comparison result is the down determination corresponds to a state in which a change in temperature is not large. Accordingly, the current temperature detection data DTD may maintain the value of the previous temperature detection data DTD (step S106).

In addition, a case where the result of the determination processing based on the first comparison result is the down determination and the result of the determination processing based on the second comparison result is the up determination is a state that cannot occur normally. In this case, the current temperature detection data DTD maintains the value of the previous temperature detection data DTD (step S106).

After the processing of any of steps S104 to S106, it is determined whether or not the normal operation mode ends, for example, it is determined whether or not a disable signal is input (step S107), and in a case of Yes in S107, the normal operation mode ends. In a case of No, the processing returns to step S101 to be continued.

Hereinafter, an operation of the A/D conversion circuit 20 in the high speed mode will be described. FIG. 9 illustrates a setting example of a determination period in the high speed mode. A horizontal axis of FIG. 9 represents time. An upper stage of FIG. 9 represents a mode, in which three modes (mode 1 to mode 3) having different determination period lengths even in the high speed mode are set. A lower stage of FIG. 9 illustrates which bit of the A/D conversion result data of 15-bit becomes a determination target. A notation of D[x:y] represents data having a width of x−y+1 bits from a y-th bit to an x-th bit counted from the least significant bit (LSB) in the A/D conversion result data. Since the least significant bit is D[0], for example, D[14:13] represents two bits on the most significant bit (MSB) side.

Figure 9:
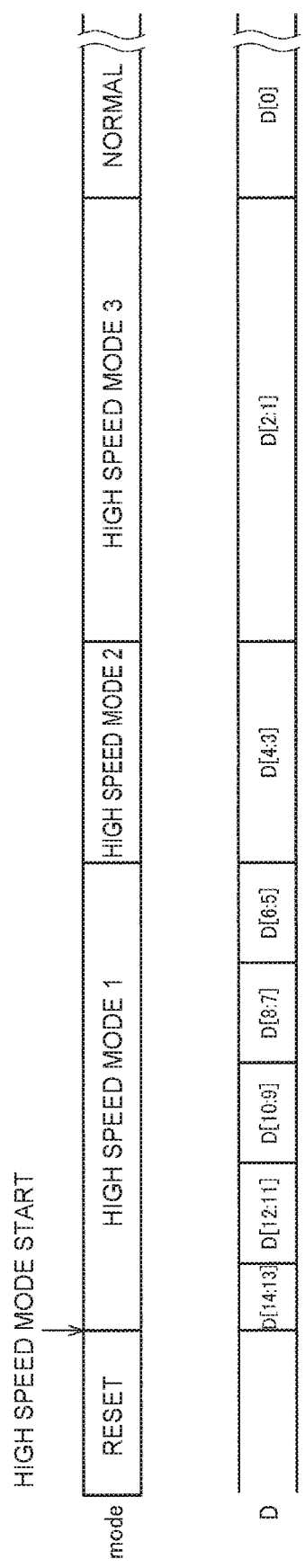
FIG. 9 illustrates a setting example of a determination period in a high-speed mode.

As can be seen from FIG. 9, mode 1 having the shortest determination period (the highest speed) is set in five sections D[14:13] to D[6:5]. In FIG. 9, lengths of the determination periods differ from each other in D[14:13] and the other sections, but this occurs from the viewpoint that there is no need to consider carry and borrow in the most significant bit, and there is no difference in the time required for comparison processing once.

In D[4:3], mode 2 having a longer determination period than the mode 1 is set, and in D[2:1], mode 3 having a longer determination period is set. In addition, in D[0] which is the least significant bit, the determination period is set to be longer than in the mode 3. Although details will be described below, for example, determination of D[0] may be realized by the same processing as in the normal operation mode described above.

Figure 10:
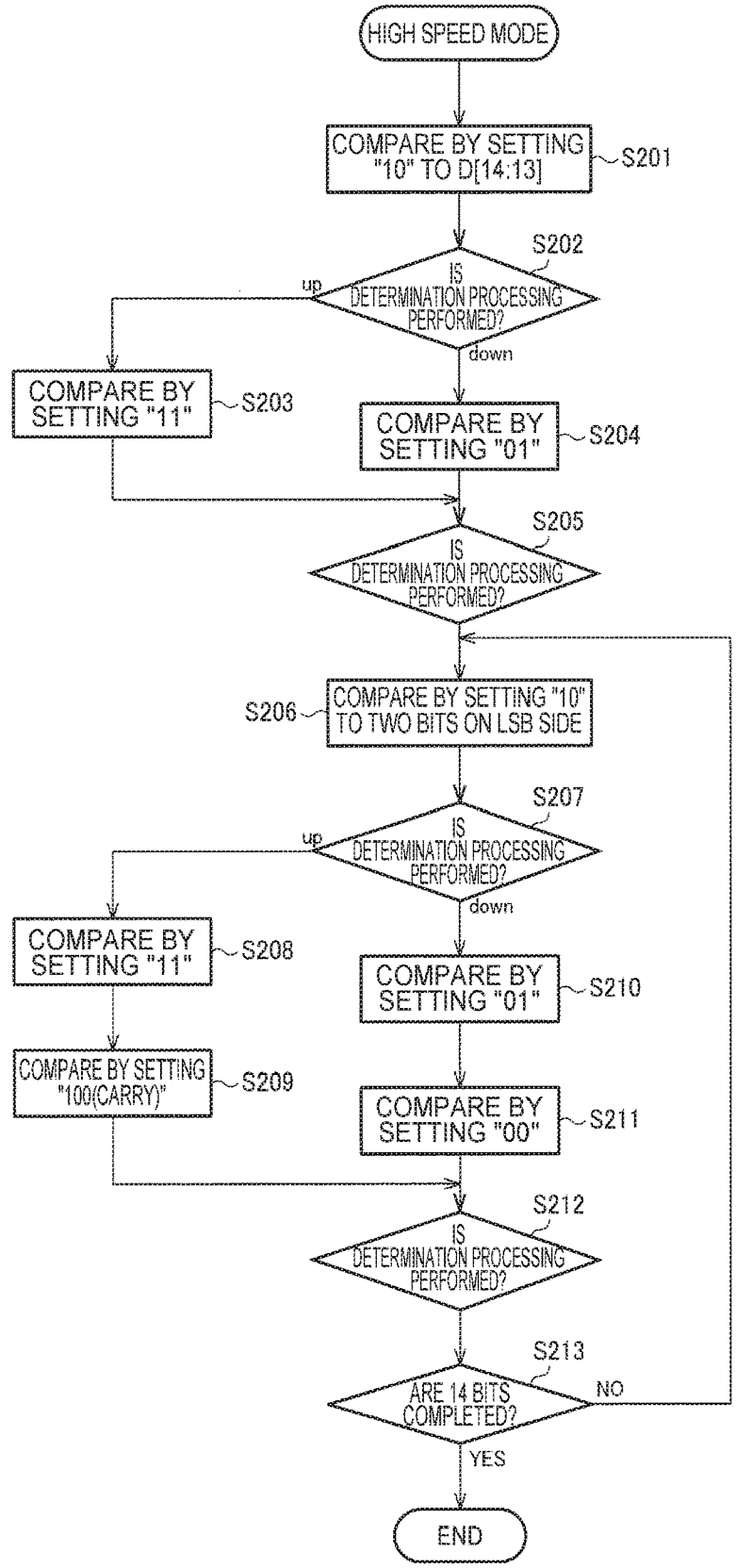
FIG. 10 is a flowchart illustrating a specific processing flow in the high-speed mode.

FIG. 10 is a flowchart illustrating a specific processing flow in the high speed mode. The high speed mode is roughly divided into a portion (steps S201 to S205) for determining D[14:13] and a portion (steps S206 to S213) for determining D[12:1]. A difference between the two portions is presence or absence of carry and borrow toward the MSB side. This will be described in detail below.

At the start of the high speed mode, an intermediate value (initial value) is set as the A/D conversion result data. For example, data represented by "100000000000000" is set. First, in the determination of D[14:13], the D/A conversion voltage VDAC is generated by D/A-converting the data in which "10" is set to two bits, and the D/A conversion voltage VDAC is compared with the temperature detection voltage VTD' (step S201), and the processing circuit 23 performs the determination processing based on the result (step S202). In the other 13 bits which are not to become the determination target, a previously determined value or the initial value may be set. In a case of D[14:13], D[12:0] is not determined yet and all the initial values are 0, and thus, the data in a case where "10" is set to D[14:13] is "100000000000000".

In a case where VTD'>VDAC in step S202, that is, it is determined as the up determination, the D/A conversion voltage VDAC is generated by performing the D/A conversion of data in which "11" is set to D[14:13], and the generated D/A conversion voltage is compared with the temperature detection voltage VTD' (step S203). Meanwhile, in a case where VTD'<VDAC in step S202, that is, it is determined as the down determination, the D/A conversion voltage VDAC is generated by performing D/A conversion of data in which "01" is set to D[14:13], and the generated D/A conversion voltage is compared with the temperature detection voltage VTD' (step S204).

Then, the processing circuit 23 determines the result of step S203 or S204 (step S205). In a case where it is determined as the up determination with respect to "10" and it is also determined as the up determination with respect to "11", let D[14:13]="11". In a case where it is determined as the up determination with respect to "10" and it is determined as the down determination with respect to "11", let D[14:13]="10". In a case where it is determined as the down determination with respect to "10" and it is determined as the up determination with respect to "01", let D[14:13]="01". In a case where it is determined as the down determination with respect to "10" and it is also determined as the down determination with respect to "01", let D[14:13]="00".

The above processing is the same as a general comparison processing, and particularly, carry and borrow may not be considered.

Next, the processing proceeds to the determination processing on the two-bit LSB side. First, the D/A conversion voltage VDAC is generated by performing D/A conversion of data in which "10" is set to the two bits of D[12:11], the generated D/A conversion voltage VDAC is compared with the temperature detection voltage VTD' (step S206), and the processing circuit 23 performs the determination processing based on the result (step S207). In this case, the value determined in step S205 is set to D[14:13], and the initial value (here, "0") is set to D[10:0]. For example, in a case where it is determined that D[14:13]="11", the data set in step S206 is "111000000000000".

In a case of the up determination in step S207, the D/A conversion voltage VDAC is generated by performing the D/A conversion of data in which "11" is set to D[12:11], and the generated D/A conversion voltage is compared with the temperature detection voltage VTD' (step S208). However, even if VTD'>VDAC in a case where "11" is set, it is simply determined that D[12:11] is "11" as described above in step S205, and bits on the MSB side (here, D[14:13]) cannot be modified. Thus, in order to consider the carry, it is necessary to set a larger value than "11" in setting a value to D[12:11].

Specifically, the D/A conversion voltage VDAC is generated by performing the D/A conversion of data in which data in a state where the carry occurs is set, and the generated D/A conversion voltage is compared with the temperature detection voltage VTD' (step S209). In this example, D[12:11]="00" and the value of D[13] may be increased by one. For example, if it is determined that D[14:13]="01", D[14:11]="1000" is set. That is, D[14:11]="0111" is set in step S208, and "1000" larger than "0111" is set in step S209.

In addition, in a case of the down determination in step S207, the D/A conversion voltage VDAC is generated by performing the D/A conversion of data in which "01" is set to D[12:11], and the generated D/A conversion voltage VDAC is compared with the temperature detection voltage VTD' (Step S210). However, even if VTD'<VDAC in a case where "01" is set, it is simply determined that D[12:11] is "00" as described above in step S205, and the bits on the MSB side cannot be modified (specifically, modification to decrease). Thus, in order to consider the borrow, it is necessary to set a smaller value than "01" in setting a value to D[12:11]. Specifically, the D/A conversion voltage VDAC is generated by performing the D/A conversion of data in which "00" is set to D[12:11], and the generated D/A conversion voltage VDAC is compared with the temperature detection voltage VTD' (step S211).

Then, the processing circuit 23 performs the determination processing based on the comparison result of steps S208 and S209 or the comparison result of steps S210 and S211. First, a case of the up determination in step S207 will be described. In this case, comparison processing in steps S208 and S209 is performed, there are the up determination and the down determination for each, and thus, four patterns in total can be obtained.

In a case of the up determination in both steps S208 and S209, it is found that the temperature detection voltage VTD' is large enough to require the carry. Thus, values of two bits which are determination targets are determined as "00", and 1 is added to the bit on the one MSB side. In addition, in a case of the down determination in both steps S208 and S209, it is found that the temperature detection voltage VTD' is between a case where "10" is set and a case where "11" is set, and thus, the two bits which are determination targets are determined as "10".

In addition, in a case of the up determination in step S208 and the down determination in step S209, it is found that the temperature detection voltage VTD' is between a case where "11" is set and a case where the carry occurs, and thus, the two bits which become determination targets are determined as "11".

In addition, in a case of the down determination in step S208 and the up determination in step S209, it is found that the voltage is an error state which is not normal. Various types of processing can be considered in a case of the error state, but here, it is assumed that a value of "11" is set. That is, for steps S208 and S209, values are determined in consideration of three patterns of (1) a case of both up determination, (2) a case of both down determination, and (3) a case where one is up determination and the other is down determination.

Next, a case of the down determination in step S207 will be described. In this case, comparison processing in steps S210 and S211 is performed, there are the up determination and the down determination for each, and thus, four patterns in total can be obtained.

In a case of the up determination in both steps S210 and S211, it is found that the temperature detection voltage VTD' is between a case where "01" is set and a case where "10" is set, and thus, the two bits which are determination targets are determined as "01". In a case of the down determination in both steps S210 and S211, it is found that the temperature detection voltage VTD' is small enough to require the borrow. Thus, values of the two bits which are determination targets are determined as "11", and 1 is subtracted from a bit on the one MSB side. For example, in a case where D[14:13]="10" and it is determined that the borrow is required in D[12:11], it may be determined that D[14:11]="0111".

In addition, in a case of the down determination in step S210 and the up determination in step S211, it is found that the temperature detection voltage VTD' is between a case where "00" is set and a case where "01" is set, and thus, the two bits which are determination targets are determined as "00".

In addition, in a case of the up determination in step S210 and the down determination in step S211, it is found that the voltage is in an error state which is not normal. Various types of processing can be considered in a case of the error state, but here, it is assumed that a value of "00" is set. That is, also for steps S210 and S211, values are determined in consideration of three patterns of (1) a case of both up determination, (2) a case of both down determination, and (3) a case where one is up determination and the other is down determination.

According to the above embodiment, the A/D conversion circuit 20 performs the A/D conversion by using the first A/D conversion method during the activation period and performs the A/D conversion by using the second A/D conversion method different from the first A/D conversion method during the normal operation period.

Here, the first A/D conversion method corresponds to the A/D conversion method in the high speed mode described with reference to FIGS. 9 and 10, and the activation period is a period in which the A/D conversion circuit 20 is set to the high speed mode. The second A/D conversion method corresponds to the A/D conversion method in the normal operation mode described with reference to FIG. 8, and the normal operation period is a period in which the A/D conversion circuit 20 is set to the normal operation mode.

By doing so, it is possible to make the A/D conversion method different between the activation period and the subsequent normal operation period of the circuit device 100. For example, the first A/D conversion result data can be acquired at high speed by using the first A/D conversion method during the activation period of the circuit device 100, and the A/D conversion can be performed by using an appropriate second A/D conversion method according to the application which uses the A/D conversion result data during the subsequent normal operation period.

For example, in the present embodiment, the A/D conversion result data is changed by k×LSB in one A/D conversion in the second A/D conversion method (normal operation mode). Specifically, the minimum resolution of data in the A/D conversion is set to the LSB, the A/D conversion result data at the first output timing is set to the first A/D conversion result data, and the A/D conversion result data at the second output timing subsequent to the first output timing is set to the second A/D conversion result data. In this case, the processing circuit 23 performs processing of obtaining the A/D conversion result data using the second A/D conversion method such that a change in the second A/D conversion result data with respect to the first A/D conversion result data is less than or equal to k×LSB (k is an integer satisfying k<j and j is an integer representing resolution of A/D conversion).

By doing so, it is possible to reduce a time change of the temperature detection data. In a case where the temperature detection data suddenly changes, the oscillation frequency can be suddenly changed (frequency hopping) by the temperature compensation processing, but the A/D conversion result data can be changed by k×LSB in one A/D conversion, and thus, it is possible to reduce a change in the oscillation frequency. For example, in a case where an oscillator including the circuit device 100 according to the present embodiment is used for a GPS receiver, a problem such as GPS lock being released due to the frequency hopping occurs. According to the present embodiment, it is possible to reduce a possibility that the problem occurs.

In addition, in the present embodiment, the A/D conversion circuit 20 includes the register 24 that stores the determination result data, the D/A converter 26 that performs the D/A conversion of the determination result data to output the D/A conversion voltage VDAC, the comparator 27 that compares the temperature detection voltage VTD' (VTD) with the D/A conversion voltage VDAC, and the processing circuit 23 that performs the determination processing based on the comparison result of the comparator 27, updates the determination result data based on the determination processing, and obtains the A/D output temperature detection data DTD. In the first A/D conversion method, the processing circuit 23 performs the determination processing of the A/D output temperature detection data DTD on the MSB side during the first determination period and performs the determination processing of the A/D output temperature detection data DTD on the LSB side during the second determination period which is longer than the first determination period. In the second A/D conversion method, the processing circuit 23 obtains the A/D output temperature detection data DTD using the A/D output temperature detection data DTD as an initial value during the activation period.

The first determination period is the determination period in the mode 1 illustrated in FIG. 9. Specifically, the first determination period is a determination period in which two bits of D[14:13], D[12:11], and the like on the MSB side are determined. The second determination period is a determination period in the mode 2 or the mode 3 illustrated in FIG. 9. Specifically, the second determination period is a determination period in which two bits of D[4:3], D[2:1], and the like on the LSB side are determined.

A voltage difference which will be determined by the comparator 27 is smaller on the LSB side than on the MSB side. In the present embodiment, since the determination period is longer on the LSB side than on the MSB side, the more highly accurate determination (voltage comparison) can be performed on the LSB side than on the MSB side. Meanwhile, since the determination period is shorter on the MSB side than on the LSB side, a period (A/D conversion period) in which the A/D conversion is performed once can be shortened. Thereby, the A/D output temperature detection data can be acquired at high speed during the activation period KP. In the second A/D conversion method, the A/D output temperature detection data DTD is obtained by using the A/D output temperature detection data DTD as an initial value during the activation period, and thus, the A/D conversion can start from the initial value during the normal operation period. Specifically, since the A/D output temperature detection data DTD is changed by k×LSB at a time in the second A/D conversion method, an initial value is needed. It is possible to use the A/D output temperature detection data DTD as the initial value during the activation period.

4. Modification Example

Figure 11:
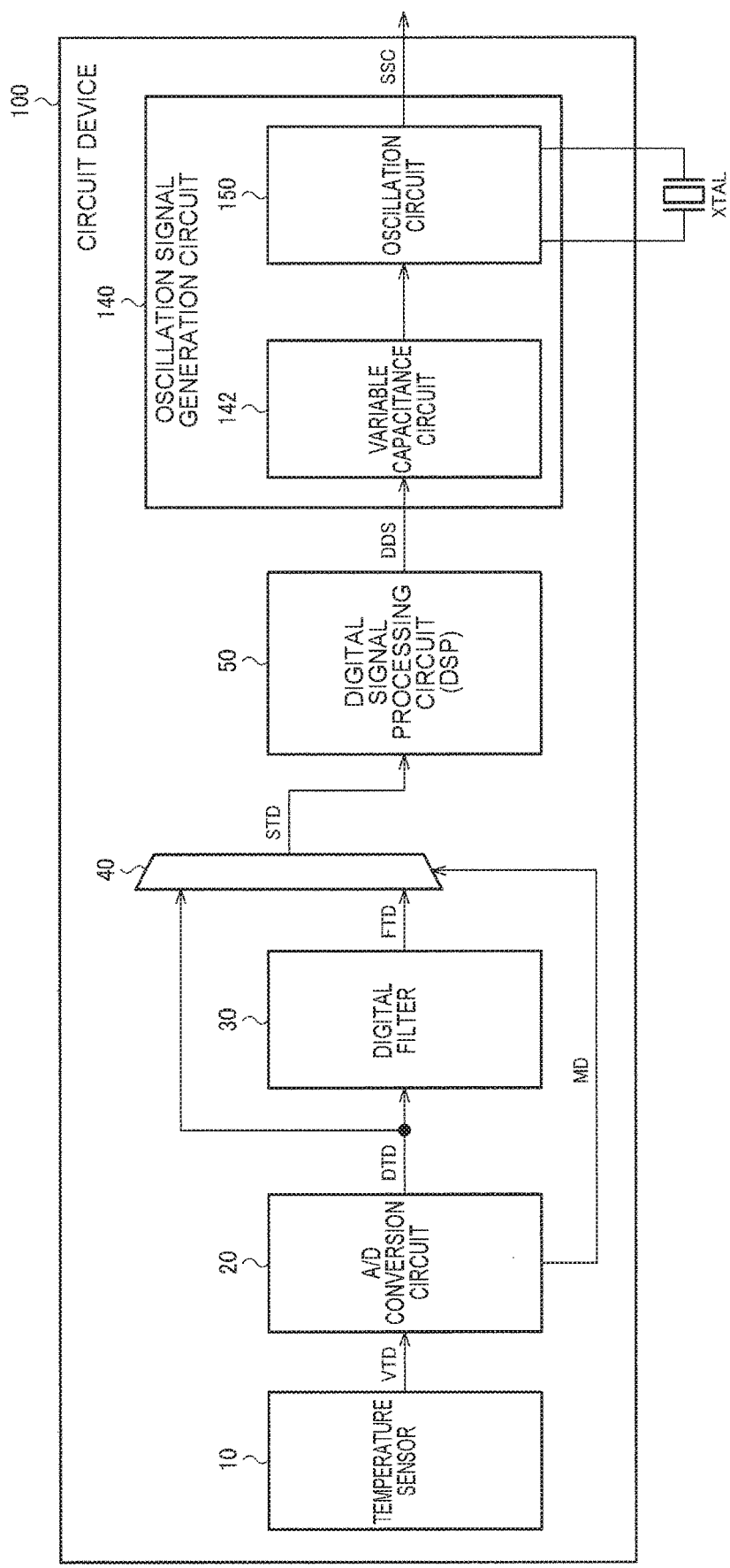
FIG. 11 illustrates a modified configuration example of the circuit device according to the embodiment.

FIG. 11 illustrates a modified configuration example of the circuit device 100 according to the present embodiment. In FIG. 11, an oscillation signal generation circuit 140 includes a variable capacitance circuit 142 and an oscillation circuit 150. The same configuration elements as in FIG. 1 are denoted by the same reference numerals or symbols, and description on the configuration elements will be appropriately omitted.

One end of the variable capacitance circuit 142 is connected to one end (one of first and second vibrator terminals) of an oscillator element XTAL. The other end of the variable capacitance circuit 142 is connected to a node of a reference voltage (for example, a ground voltage). The variable capacitance circuit 142 is provided instead of a variable capacitor in a VCO. For example, in FIG. 1, the oscillation circuit 150 includes the variable capacitor, one end of the variable capacitor is connected to one end of the oscillator element XTAL, and an output voltage VQ of the D/A conversion circuit 80 is input to the variable capacitor as a control voltage of the variable capacitor. In FIG. 11, the variable capacitance circuit 142 is provided instead of the variable capacitor, and the oscillation signal generation circuit 140 does not include a D/A conversion circuit.

The variable capacitance circuit 142 controls the capacitance value, based on frequency control data DDS from the digital signal processing circuit 50. For example, the variable capacitance circuit 142 includes a plurality of capacitors (capacitor array) and a plurality of switch elements (switch array), each being controlled to be turned on or off based on the frequency control data DDS. Each of the plurality of switch elements is electrically connected to each of the plurality of capacitors. By turning on or off the plurality of switch elements, the number of capacitors whose one end is connected to one end of the oscillator element XTAL among the plurality of capacitors is changed. Thereby, a capacitance value of the variable capacitance circuit 142 is controlled, and a capacitance value of one end of the oscillator element XTAL is changed. Accordingly, the capacitance value of the variable capacitance circuit 142 is directly controlled by the frequency control data DDS, such that an oscillation frequency of the oscillation signal SSC can be controlled.

5. Oscillator, Electronic Apparatus, Vehicle

Figure 12:
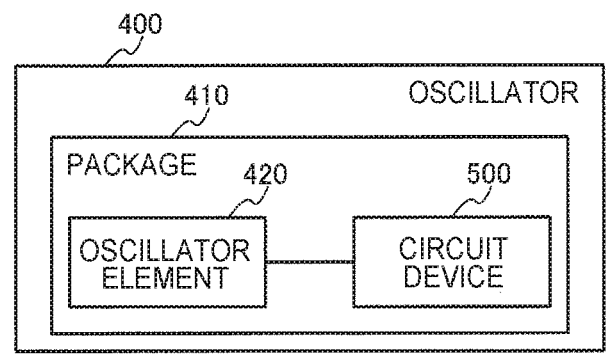
FIG. 12 illustrates a configuration example of an oscillator.

FIG. 12 illustrates a configuration example of an oscillator 400 including the circuit device 500 according to the present embodiment. The oscillator 400 includes an oscillator element 420 (vibrator) and a circuit device 500. The circuit device 500 corresponds to the circuit device 100 in FIGS. 1 and 8, and the oscillator element 420 corresponds to the oscillator element XTAL in FIGS. 1 and 8. The oscillator element 420 and the circuit device 500 are mounted in a package 410 of the oscillator 400. A terminal of the oscillator element 420 and a terminal (pad) of the circuit device 500 (IC) are electrically connected to each other by an internal wire of the package 410.

A configuration of an oscillator including the circuit device 500 according to the present embodiment is not limited to FIG. 12. For example, the terminal of the oscillator element 420 is connected to the terminal (pad) of the circuit device 500 (IC) by a metal bump, and thereby, the oscillator element 420 may be mounted right above a semiconductor chip of the circuit device 500, and the circuit device 500 and the oscillator element 420 may be contained in the package 410.

Figure 13:
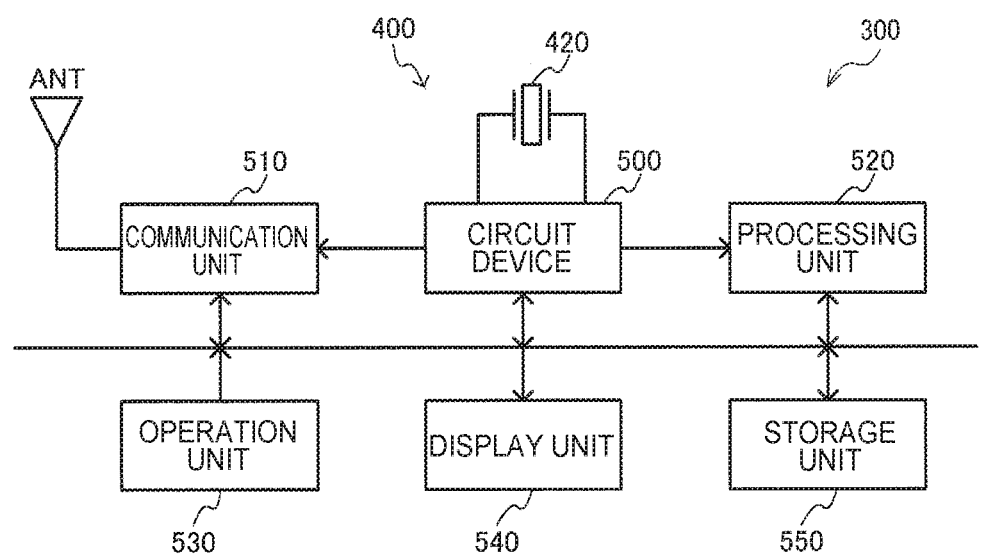
FIG. 13 illustrates a configuration example of an electronic apparatus.

FIG. 13 illustrates a configuration example of an electronic apparatus 300 including the circuit device 500 according to the present embodiment. The electronic apparatus 300 includes the oscillator 400 including the circuit device 500 and the oscillator element 420, and a processing circuit 520. In addition, the electronic apparatus can include a communication unit 510, an operation unit 530, a display unit 540, a storage unit 550, and an antenna ANT.

Various apparatuses can be used as the electronic apparatus 300. For example, a wearable apparatus such as a GPS built-in timepiece, a biological information measurement apparatus (a pulse wave meter, a pedometer, or the like) or a head mounted display device can be used as the electronic apparatus. Alternatively, a mobile information terminal (mobile terminal) such as a smartphone, a mobile phone, a portable game device, a notebook PC or a tablet PC can be used as the electronic apparatus. Alternatively, a content providing terminal that distributes content, a video apparatus such as a digital camera or a video camera, or a network related apparatus such as a base station or a router can be used as the electronic apparatus. Alternatively, a measurement apparatus for measuring a physical quantity such as a distance, time, a flow speed or a flow amount, an in-vehicle apparatus (an automatic driving apparatus or the like), a robot, and the like can be used as the electronic apparatus.

The communication unit 510 (wireless circuit) receives data from the outside via the antenna ANT and transmits data to the outside. The processing circuit 520 performs control processing of the electronic apparatus, various types of digital processing of data transmitted and received via the communication unit 510, and the like. A function of the processing circuit 520 can be realized by a processor such as a microcomputer. The operation unit 530 is for a user to perform an input operation, and can be realized by an operation button, a touch panel display, or the like. The display unit 540 displays various types of information and can be realized by a display such as a liquid crystal or an organic EL. The storage unit 550 stores data, and a function thereof can be realized by a semiconductor memory such as a RAM or a ROM, a hard disk drive (HDD), or the like.

Figure 14:
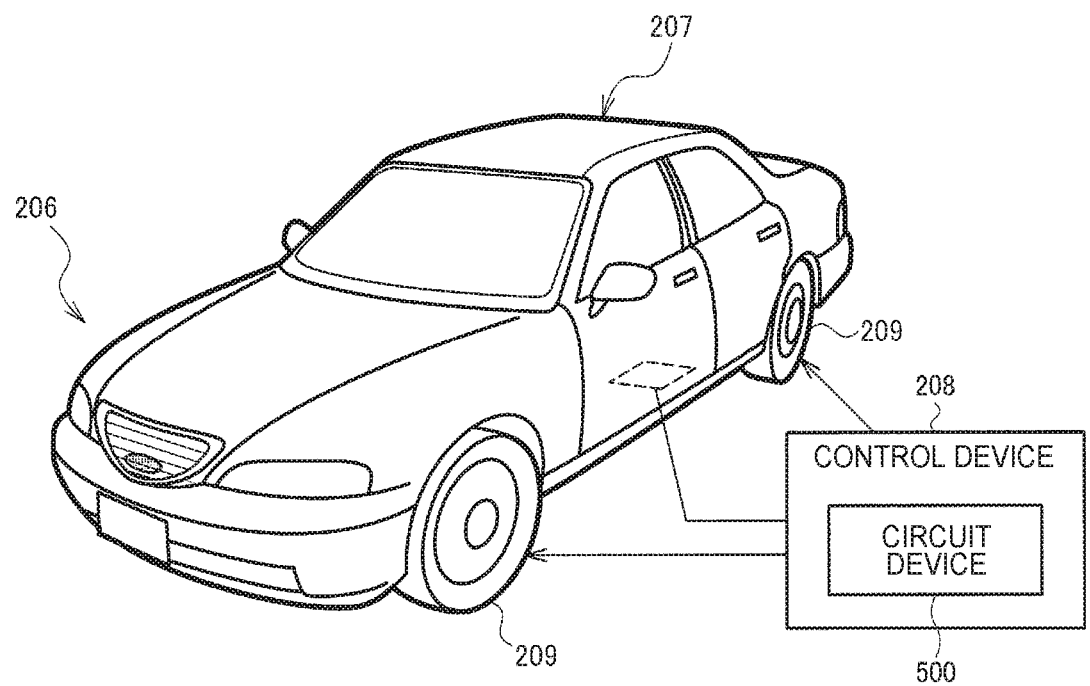
FIG. 14 illustrates an example of a vehicle.

FIG. 14 illustrates an example of a vehicle including the circuit device 500 according to the present embodiment. The circuit device 500 according to the present embodiment can be incorporated in various moving bodies such as a car, an airplane, a motorcycle, a bicycle, a robot, a ship, and the like. The vehicle is an apparatus or a device that includes a drive mechanism such as an engine or a motor, a steering mechanism such as a steering wheel or a rudder, and various types of electronic apparatuses (in-vehicle apparatuses) and moves on the ground, the sky, or the sea. FIG. 14 schematically illustrates an automobile 206 as a specific example of the vehicle. An oscillator (not illustrated) including the circuit device 500 according to the present embodiment is incorporated in the automobile 206. A control device 208 performs various types of control processing based on an oscillation signal (clock signal) generated by the oscillator. For example, the control device 208 controls hardness of a suspension according to a posture of a vehicle body 207 and controls brakes of separate wheels 209. An apparatus into which the circuit device 500 (oscillator) according to the present embodiment is incorporated is not limited to the control device 208, and can be incorporated in various apparatuses provided in a moving object such as the automobile 206 or a robot.

The present embodiment is described in detail as described above, and those skilled in the art will easily understand that many modifications can be made which do not deviate practically from the novel matters and effects of the invention. Thus, all the modification examples are included in the scope of the invention. For example, in the specification or the drawings, a term described at least once together with a different term which is broader or equivalent can be replaced with the different term at any point in the specification or the drawings. In addition, all combinations of the present embodiments and modification examples are included in the scope of the invention. In addition, the configurations, the operations, and the like of the circuit device, the oscillator, the electronic apparatus, or the vehicle are not limited to the description on the present embodiment, and various modifications can be made.

The entire disclosure of Japanese Patent Application No. 2017-221537, filed Nov. 17, 2017 is expressly incorporated by reference herein.

What is claimed is:

1. A circuit device comprising:
   an A/D conversion circuit that performs an A/D conversion of a temperature detection voltage from a temperature sensor and outputs data for which the A/D conversion is completed as A/D output temperature detection data;
   a digital filter that performs digital filter processing of the A/D output temperature detection data and outputs data for which the digital filter processing is completed as filter output temperature detection data;
   a selector that selects the A/D output temperature detection data during an activation period to output as selector output temperature detection data and selects the filter output temperature detection data during a normal operation period after the activation period to output as the selector output temperature detection data;
   a digital signal processing circuit that outputs frequency control data of an oscillation frequency based on the selector output temperature detection data; and
   an oscillation signal generation circuit that generates an oscillation signal of the oscillation frequency which is set by the frequency control data from the digital signal processing circuit.

2. The circuit device according to claim 1,
   wherein the A/D conversion circuit performs a given number of A/D conversion during the activation period, and during the normal operation period after the given number of A/D conversion ends, the selector selects the filter output temperature detection data to output as the selector output temperature detection data.

3. The circuit device according to claim 2,
   wherein the digital filter performs the digital filter processing by using the A/D output temperature detection data that is obtained by the A/D conversion during the activation period as an initial value.

4. The circuit device according to claim 1,
   wherein the A/D conversion circuit outputs a mode control signal for switching an operation of the selector, and
   wherein the selector selects the A/D output temperature detection data during the activation period, based on the mode control signal, and selects the filter output temperature detection data during the normal operation period.

5. The circuit device according to claim 1,
   wherein the A/D conversion circuit performs an A/D conversion using a first A/D conversion method during the activation period and performs an A/D conversion using a second A/D conversion method different from the first A/D conversion method during the normal operation period.

6. The circuit device according to claim 5,
   wherein the A/D conversion circuit includes a register that stores determination result data, a D/A converter that performs a D/A conversion of the determination result data and outputs a D/A conversion voltage, a comparator that compares the temperature detection voltage and the D/A conversion voltage, and a processing circuit that performs determination processing based on a comparison result of the comparator, updates the determination result data based on the determination processing, and obtains the A/D output temperature detection data, wherein the processing circuit performs the determination processing of the A/D output temperature detection data on an MSB side during a first determination period and performs the determination processing of the A/D output temperature detection data on an LSB side during a second determination period longer than the first determination period, using the first A/D conversion method, and wherein the processing circuit obtains the A/D output temperature detection data using the A/D output temperature detection data as an initial value during the activation period, using the second A/D conversion method.

7. The circuit device according to claim 1,
wherein, when a time constant of the digital filter processing is referred to as τ and an activation stabilization time which is time in which the oscillation frequency reaches the frequency range where a frequency deviation from a nominal oscillation frequency is within ±0.5 ppm is referred to as Ts, Ts<τ is satisfied.

8. The circuit device according to claim 5,
wherein, when a length of the activation period in which the A/D conversion circuit performs an A/D conversion using the first A/D conversion method is referred to as Tc and a time constant of the digital filter processing is referred to as τ, Tc<τ is satisfied.

9. An oscillator comprising:
the circuit device according to claim 1.

10. An electronic apparatus comprising:
the circuit device according to claim 1.

11. A vehicle comprising:
the circuit device according to claim 1.

* * * * *